United States Patent [19]

Garverick

[11] Patent Number: 5,126,961
[45] Date of Patent: Jun. 30, 1992

[54] PLURAL-CHANNEL DECIMATION FILTER, AS FOR SIGMA-DELTA ANALOG-TO-DIGITAL CONVERTERS

[75] Inventor: Steven L. Garverick, Schenectady, N.Y.

[73] Assignee: General Electric Company, Schenectady, N.Y.

[21] Appl. No.: 665,208

[22] Filed: Mar. 6, 1991

[51] Int. Cl.$^5$ .............................................. G06F 15/31
[52] U.S. Cl. ................................................ 364/724.10
[58] Field of Search ...................... 364/724.10, 724.01, 364/728.01, 728.03, 754, 757; 341/122, 143

[56] References Cited

U.S. PATENT DOCUMENTS

| | | | |
|---|---|---|---|
| 4,860,240 | 8/1989 | Hartley et al. | 364/757 |
| 4,896,156 | 1/1990 | Garverick | 341/143 |
| 4,910,700 | 3/1990 | Hartley | 364/754 |
| 4,939,687 | 7/1990 | Harley et al. | 364/757 |
| 4,951,052 | 3/1990 | Jacob et al. | 341/122 |
| 4,982,353 | 1/1991 | Jacob et al. | 364/724.10 |

Primary Examiner—Long T. Nguyen
Attorney, Agent, or Firm—Marvin Snyder; James C. Davis, Jr.

[57] ABSTRACT

A decimation filter in which two filtering processes are carried out on a time-division-multiplexed basis using kernels that are sampled-data representations of triangular waves, one of which waves decrements while the other increments, or vice versa. A digital multiplier is connected for receiving the time interleaved kernels and a stream of bits supplied at a rate that is one-quarter of which the filter clock pulses regularly recur. The multiplier's output is connected to the addend input of a parallel-bit adder. The adder's output is connected to a cascade connection of first, second, third and fourth clocked latches. The output signal of the fourth latch is supplied to the adder's augend input except during the first four clock pulse durations after the kernel values reach maxima. The output signal of the third latch is supplied to the adder's augend input during zeroeth and second clock pulse durations after the kernel values reach maxima, and arithmetic zero is supplied to the adder's augend input during the first and third clock pulse durations after the kernel values reach maxima. The filter's first and second output signals are extracted from the outputs of the second and fourth latches. This filter can be used on a single-channel basis. Alternatively, this filter is used on a dual-channel basis with a two-input multiplexer supplying the stream of bits to one of the multiplier's inputs. Also, plural of these filters can be joined to provide multiple-channel decimation filtering.

7 Claims, 16 Drawing Sheets

FIG. 3

| MSB ←→ LSB | | LSBs PROM 9 ADDRESS |
|---|---|---|
| READ1 (3) \| READ 0 (5) | MAP ADR | 0000 |
| WR0 (1) \| WRITE (5) \| READ1 (2) | MAP ADR | 0001 |
| MAP CNTL (8) | MAP ADR | 0010 |
| MAP CNTL (8) | MAP ADR | 0011 |
| MAP COEF (8) | MAP ADR | 0100 |
| CORDIC CNTL (CC0) (8) | CORDIC ADR | 0101 |
| MAP COEF (8) | MAP ADR | 0110 |
| CORDIC CNTL (CC1) (8) | CORDIC ADR | 0111 |
| READ1 (3) \| READ0 (5) | MAP ADR | 1000 |
| WR0 (1) \| WRITE (5) \| READ1 (2) | MAP ADR | 1001 |
| MAP CNTL (8) | MAP ADR | 1010 |
| MAP CNTL (8) | MAP ADR | 1011 |
| MAP COEF (8) | MAP ADR | 1100 |
| CORDIC COEF (8) | CORDIC ADR | 1101 |
| MAP COEF (8) | MAP ADR | 1110 |
| CORDIC COEF (8) | CORDIC ADR | 1111 |

8-BYTE UNIT (BLOCK) ADDRESSED WHEN BIT3 OF PROM 9 ADDRESS IS 0 (upper block)

8-BYTE UNIT (BLOCK) ADDRESSED WHEN BIT3 OF PROM 9 ADDRESS IS 1 (lower block)

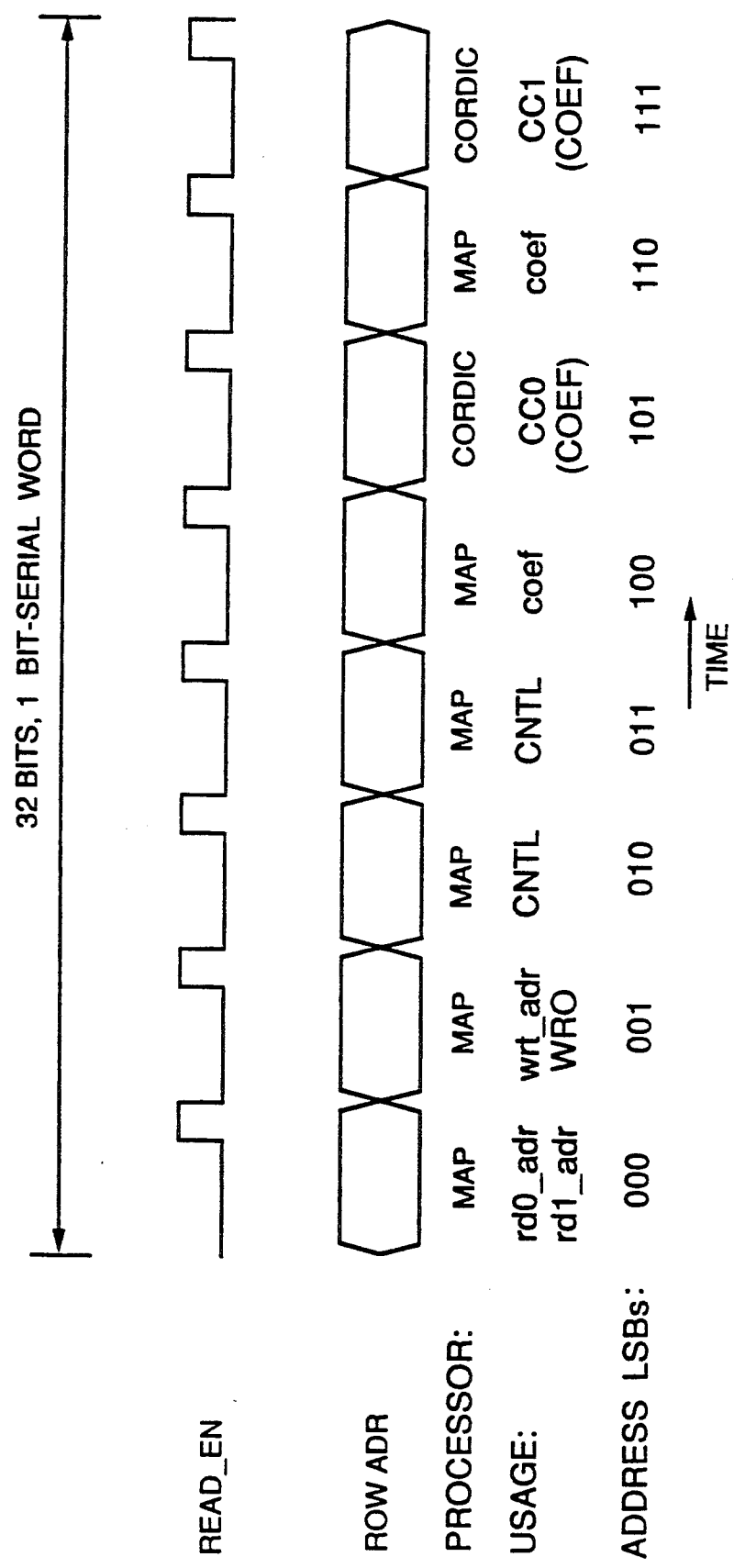
FIG. 4 ROM TIMING CHART

TRINC TIMING CHART

PLURAL-CHANNEL DECIMATION FILTER, AS FOR SIGMA-DELTA ANALOG-TO-DIGITAL CONVERTERS

The invention relates to decimation filtering for sigma-delta analog-to-digital converters.

RELATED PATENT APPLICATION

The plural-channel decimation filtering to be described is used in power metering circuitry as described in U.S. patent application Ser. No. 653,935 filed 11, Feb. 1991 by S. Garverick et alii; entitled "DATA ACQUISITION SYSTEMS WITH PROGRAMMABLE BIT-SERIAL DIGITAL SIGNAL PROCESSORS"; and assigned to General Electric Company and Yokagawa Electric Corporation as assignees in common.

BACKGROUND OF THE INVENTION

Bit-serial digital signal processing is known to be efficient, from the standpoint of the amount of digital hardware required, for computing fixed algorithms involving multiplication and addition processes. However, when programmable algorithms are to be employed, or when considerable memory is involved in carrying out an algorithm, as in a general-purpose computer or in a microprocessor, electronic designers have used bit-parallel processing instead of bit-serial digital signal processing.

Data acquisition systems for generating digital data for the purposes of computation may receive analog input signals from a plurality of sensors, which analog signals must be digitized before they can be used by a computer as a basis for supporting computations. It is desirable to include respective analog-to-digital converters for the analog output signals from the various sensors within the confines of an inexpensive single monolithic integrated circuit, together with some simple initial processing circuitry. Such data acquisition circuitry can be constructed using metal-oxide-semiconductor (MOS) integrated circuit technology and is suited for applications such as power metering and internal-combustion engine control.

Since the unit cost of monolithic integrated circuits tends to go up with the complexity of the digital hardware within their confines, analog-to-digital converters, multiplexers, and digital signal processors that are economical of the digital hardware involved were particularly considered by the inventor and his co-workers. Bit-serial mulitplexers and processors are particularly economical of digital hardware; and an interconnection for a bit-serial signal requires but two lines, one line for conducting the serial flow of data bits, and the other line for conducting parsing signals. The speed requirements upon a digital signal processor in a data acquisition system are often not so onerous but that bit-serial computations are likely to be found to be fast enough. Oversampling analog-to-digital converters of sigma-delta type, particularly those with first-order sigma-delta modulators, are economical of digital hardware.

The use of a plurality of oversampling analog-to-digital converters of sigma-delta type introduces the need for a plural-channel decimation filter. There is a desire to use $sinc^2$ digital filtering, in which the kernel is a sampled-data representation of a triangular time-domain response, to achieve sufficient selectivity against harmonic components of the sinusoids being filtered, and at the same time to keep filter latency reasonably short.

SUMMARY OF THE INVENTION

The invention is embodied in a decimation filter in which two filtering processes are carried out on a time-division-multiplexed basis using kernels that are sampled-data representations of triangular waves. Regularly recurring filter clock pulses are counted modulo-four by a first binary counter having zeroeth and first counter stages, to generate a first digital electric signal and an overflow pulse each zeroeth one of said regularly recurring filter clock pulses as counted modulo-four. A second binary counter has a plurality of successive counter stages identified by respective consecutive numbers second through $n^{th}$ for generating respective bits of a second digital electric signal representative of a modulo-$2^{(n-2)}$ count of the overflow pulses from the first binary counter. A third digital electric signal is generated by selectively complementing the second digital electric signal responsive to the least signicant bit of the first digital signal. A digital multiplier is connected for receiving the third digital electric signal as a multiplicand and for receiving as a multiplier a stream of bits supplied at a rate one-quarter that at which the filter clock pulses regularly recur. The digital multiplier is connected to apply its product output signal to the addend input port of a parallel-bit adder. The sum output port of this adder connects to the input port of a first clocked latch, which is clocked at the rate at which said filter clock pulses regularly recur. The output port of the first clocked latch connects to the input port of a second clocked latch, which is clocked at the rate at which said filter clock pulses regularly recur. The output port of the second clocked latch connects to the input port of a third clocked latch, which is clocked at the rate at which said filter clock pulses regularly recur. The output port of the third clocked latch connects to the input port of a fourth clocked latch, which is clocked at the rate at which said filter clock pulses regularly recur. The signal from the output port of the fourth clocked latch is supplied to the augend input port of the adder except during the first four clock pulse durations after the second binary counter has reached full count. The signal from the output port of the third clocked latch is supplied to the augend input port of the adder during the first and third clock pulse durations after the second binary counter has reached full count, and arithmetic zero is supplied to the augend input port of the adder during the second and fourth clock pulse durations after the second binary counter has reached full count. First and second output signals for the decimation filter are extracted from the output ports of the second and fourth clocked latches. This decimation filter can be used on a single-channel basis.

Alternatively, this decimation filter is used on a dual-channel basis in a further embodiment of the invention, with a two-input multiplexer supplying the stream of bits the digital multiplier uses as a multiplier input signal. In a still further embodiment of the invention, a plurality of these decimation filters are joined in combination to provide multiple-channel decimation filtering.

BRIEF DESCRIPTION OF THE DRAWING

FIG. 3 is a diagram of the layout of stored information in the programmable read-only memory.

FIG. 4 is a timing diagram of the operation of the programmable read-only memory.

Throughout this drawing and the accompanying specification the symbol $\Delta$ without a number thereafter is used to denote the one-word (32-bit) delay operator. The symbol $\Delta n$ where n is an integer is used to denote the n-bit delay operator. The symbol $S\&H_n$ is used to denote the operation of sampling and holding the $n^{th}$ bit of each bit-serial word in a stream of bit-serial words. The symbol $2^{m}$, where m is an integer in the range from $-31$ to zero, signifies a bit serial word in which the $(31+m)^{th}$ one of the successive bits in the 32-bit bit-serial words in a stream of bit-serial words is a ONE and all other bits are ZEROs.

DETAILED DESCRIPTION

Figure 1:
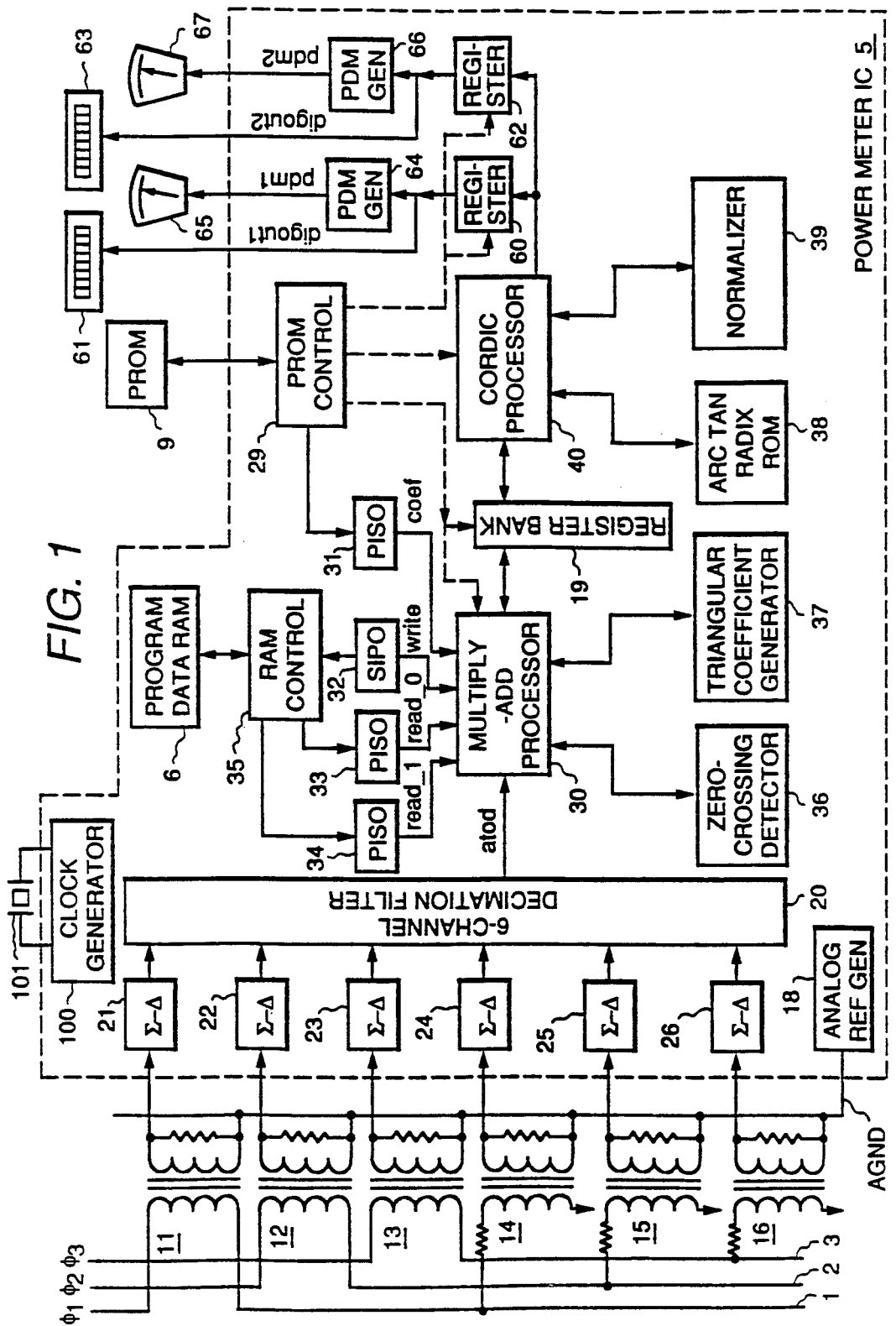
FIG. 1 is a schematic diagram of a monolithic integrated circuit connected for use in a power metering system, which i-c has therewithin oversampling analog-to-digital converters provided with a plural-channel decimation filter embodying the invention and which i-c has therewithin a digital signal processor cascade operative on digital signals in bit-serial form.

In FIG. 1 a monolithic integrated circuit 5 is to be used for monitoring a three-phase power mains having a conductor 1 for a first phase of a-c current into which the primary winding of a current-sensing transformer 11 is inserted, a conductor 2 for a second phase of a-c current into which the pimary winding of a current-sensing transformer 12 is inserted, and a conductor 3 for a third phase of a-c current into which the pimary winding of a current-sensing transformer 13 is inserted. A voltage-sensing transformer 14 has its primary winding connected for sensing the voltage between ground and the first-phase conductor 1. A voltage-sensing transformer 15 has its primary winding connected for sensing the voltage between ground and the second-phase conductor 2. A voltage-sensing transformer 16 has its primary winding connected for sensing the voltage between ground and the third-phase conductor 3.

Sigma-delta modulators 21, 22 and 23 in integrated circuit 5 digitize the voltages supplied from the secondary windings of the current-sensing transformers 11, 12, and 13, respectively, to generate digital representations of the analog currents flowing in mains conductors 1, 2 and 3, respectively. Sigma-delta modulators 24, 25 and 26 in integrated circuit 5 digitize the voltages supplied from the secondary windings of the voltage-sensing transformers 14, 15 and 16, respectively, to generate digital representations of the analog voltages appearing on mains conductors 1, 2 and 3, respectively. Oversampling analog-to-digital converters using first-order sigma-delta modulators are, by way of example, described by S. L. Garverick in U.S. Pat. No. 4,896,156 issued Jan. 23, 1990 and entitled "SWITCHED CAPACITANCE COUPLING NETWORKS FOR DIFFERENTIAL-INPUT AMPLIFIERS, NOT REQUIRING BALANCED INPUT SIGNALS". The streams of output bits from the sigma-delta modulators 21-26 flow to respective input ports of a six-channel decimation filter 20, which cyclically supplies from an output port thereof to a bit-serial multiply-add processor 30 (which will be described presently in greater detail) decimated bit-serial representations of:

(1) the analog current flowing in mains conductor 1,
(2) the analog voltage on mains conductor 1,
(3) the analog current flowing in mains conductor 2,
(4) the analog voltage on mains conductor 2,
(5) the analog current flowing in mains conductor 3, and
(6) the analog voltage on mains conductor 3.

The multiply-add processor 30 supplies a bit-serial output signal to a bank 19 of bit-serial registers, from which bit-serial input signal can be taken by a CORDIC processor 40.

The multiply-add processor 30 can be constructed using a bit-serial multiplier and a bit-serial adder for incrementing (or decrementing) the product signal from the bit-serial multiplier. Bit-serial multipliers that are amenable to being laid out on a silicon substrate by a computer known as a silicon compiler are described by R. I. Hartley and S. E. Noujaim in their U.S. Pat. No. 4,860,240 issued Aug. 22, 1989 and entitled "LOW-LATENCY TWO'S COMPLEMENT BIT-SERIAL MULTIPLIER". Bit-serial multipliers that are amenable to being laid out on a silicon substrate by a computer known as a silicon compiler are also described by R. I. Hartley and P. F. Corbett in their U.S. Pat. No. 4,910,700 issued Mar. 20, 1990 and entitled "BIT-SLICED DIGIT-SERIAL MULTIPLIER"; and in their U. S. Pat. No. 4,939,687 issued 3, July 1990 and entitled "SERIAL-PARALLEL MULTIPLIERS USING SERIAL AS WELL AS PARALLEL ADDITION OF PARTIAL PRODUCTS". R. I. Hartley and P. F. Corbett describe bit-serial adders that are amenable to being laid out on a silicon substrate by a computer known as a silicon compiler in their U.S. patent application Ser. No. 265,210 filed Oct. 31, 1988 and now U.S. Pat. No. 5,010,511 entitled "DIGIT-SERIAL LINEAR COMBINING APPARATUS USEFUL IN DIVIDERS".

An analog reference voltage AGND against which to refer the voltages supplied from first ends of the secondary windings of transformers 11-16 to sigma-delta modulators 21-26 is applied to the second ends of these secondary windings from a generator 18 for this direct voltage, located within integrated circuit 5. Clock generator circuitry 100 located within integrated circuit 5 generates clocking signals at frequencies related in specified ratio to oscillations of a crystal-controlled oscillator (not shown separately) at a 10 MHz frequency controlled by a crystal 101. The 10 MHz oscillations are divided by four within the clock generator to generate 2.5 MHz clocking for the sigma-delta modulators 21-26 to determine their oversampling rate. The decimation filter 20 is clocked to update its response to the multiply-add processor 30 at 4.9 kHz word rate. The bank 19 of bit-serial registers is clocked to update its bit-serial input signal for the CORDIC processor 40 at a little over five Hz word rate.

A programmable read-only memory (PROM) 9 stores program instructions and coefficient data for the multiply-add processor 30, as well as storing program instructions for the CORDIC processor 40. PROM control circuitry 29 is located within integrated circuit 5, applies program instructions and coefficient data appropriately to the multiply-add processor 30, and applies program instructions appropriately to the CORDIC processor 40. PROM 9 is another monolithic integrated circuit (i-c) located externally to the integrated circuit 5, since PROM 9 preferably is of electrically-erasable type, which is not easily combined with analog CMOS in a single i-c. The inventors use the NEC μPD28C04 electrically-erasable PROM, which is capable of storing 512 bytes and being read at a data rate of over 2.5 MHz, for the PROM 9. This PROM has 11 address lines and 8 data lines. The coefficients stored in the PROM 9 are sixteen-bit, two's complement numbers with the binary point following the most significant bit. The interface between integrated circuits 9 and 5 is seventeen bits wide, so a fair amount of power is required for high-speed driving across this interface.

A parallel-in/serial-out (PISO) converter 31, as controlled by the PROM control circuitry 29 (not specifically shown in FIG. 1), converts the coefficients stored in bit-parallel format in the PROM 9 to bit-serial format for application to the multiply-add processor 30. In the power metering system being specifically described, these coefficients invariably are used as miltiplicands in the bit-serial multiplier portion of the processor 30; and the design of that bit-serial multiplier could be such that parallel-to-serial conversion would not be necessary. However, where the layout of that bit-serial multiplier on the integrated circuit dies is determined by a silicon compiler that permits only standarized bit-serial designs that accept only bit-serial signals through interfaces between functional elements, SIPO converter 31 is used, as shown in FIG. 1.

(The inventors used one silicon compiler program to lay out the program data RAM 6. The sigma-delta modulators 21-26 were laid out as macrocells, as were pulse duration modulators 63 and 64. Another silicon compiler program ((as described by F. Yassa, et al. in their paper "A Silicon Compiler for Digital Signal Processing: Methodology, Implementation and Applications" in the *Proceedings of the IEEE*, Vol. 75,pp. 1272-1282, Sep. 1987)) was used to lay out the remaining bit-serial portions of the circuitry on i-c 5.)

To conserve power for the high-speed driving of a random-access program data memory 6 for the multiply-add processor 30, the program data memory 6 is located within the integrated circuit 5. The writing of the memory 6 from and the reading of memory 6 to the miltiply-add processor 30 is done via RAM control circuitry 35. A serial-in/parallel-out (SIPO) converter 32, as controlled by the RAM control circuitry 35 (not specifically shown in FIG. 1), converts the bit-serial program data from the multiply-add processor 30 to bit-parallel format for being stored in the memory 6. Parallel-in/serial-out (PISO) converters 33 and 34, as controlled by the RAM control circuitry 35 (not specifically shown in FIG. 1), converts the bit-parallel program data stored in the memory 6 two words at a time to respective first and second bit-serial streams of data for application to the multiply-add processor 30.

Accurate power measurement requires the multiply-add processor 30 to perform integrations over an integral number of cyles of the a-c signals on the mains conductors 1, 2 and 3. To detect integral number of cyles of these a-c signals, the multiply-a processor 30 supplies to a zero-crossing detector 36 high-pass-filtered versions of digital responses to these signals that the processor 30 receives from the decimation filters 27 and 28. The zero-crossing detector 36 returns indications of the zero-crossings back to the processor 30.

A triangular coefficient generator 37 communicates with the processor 30 and generates coefficients defining a triangular filter kernel when the processor 30 is programmed to perform $sinc^2$ low-pass.

The CORDIC processor 40 receives the bit-serial output signal from the multiply-add processor 30, as decimated in the bank 19 of bit-serial registers to a little over five Hz update rate. The arc tangent computations in the CORDIC processor 40 use algorithms of the nature described by J.E. Volder in the paper "The CORDIC Trignometric Computing Technique" appearing in the *IRE Transactions on Electronic Computers*, Vol. EC-8, No. 3, pp. 330-334, Sept. 1959, as more specifically described by J. S. Walther in his paper "A Unified Algorithm for Elementary Functions" appearing in pages 379-385 of the digest of the *Spring Joint Computer Conference*, 1971 and as adapted for bit-serial operation. Arc tangent radix coefficients for the CORDIC processor 40 are stored permanently in a read-only memory 38 located within the integrated circuit 5. The CORDIC processor 40 also performs non-restoring division and non-restoring square root extraction using iterative techniques of the sorts generally described by H. W. Gschwind and E. J. McCluskey in pages 278-301 their book *DESIGN OF DIGITAL COMPUTERS—An Introduction* published in 1975 by Springer-Verlag of New York, Heidelberg and Berlin, but adapted for bit-serial operation. The latency through the CORDIC processor 40 is extended to two bit-serial words length to accommodate bit-serial operation, with its one-word-less-one-bit comparison times. Accordingly, the CORDIC processor 40 performs even and odd calculations on a time-interleaved basis. The CORDIC processor 40 is capable of computing the following primitive functions, where xin and yin are input variables selected to the CORDIC processor 40:

(a) yin/xin,
(b) yin($\frac{1}{2}$),
(c) tan$^{-1}$ (yin/xin), and
(d) magnitude (xin,yin)=(xin$^2$+yin$^2$)$^{(\frac{1}{2})}$.

A normalizer circuit 39 located within the integrated circuit 5 cooperates with the CORDIC processor 40 to provide for the calculation of the further primitive function:

(e) [sign (oa2)]* (cordic_out−L)/M.

Here L and M are constants contained in CORDIC program instructions supplied from the PROM 9; and [sign(oa2)] is the polarity of the value oa2 stored in a register. The signal cordic_out is a previous output from the CORDIC processor 40, and the further primitive function is generated using the yin/xin function of the CORDIC processor 40. The symbol * denotes multiplication throughout this specification.

Processing through the CORDIC processor 40 is done on a time-division-multiplexed basis, and provision is made for metering two functions at the same time. Accordingly, bit-serial indications of the one function digout1 are loaded during selected intervals into a register 60 for subsequent application to a digital meter 61; and bit-serial indications of the other function digout2 are loaded during selected intervals into a register 62 for application to a digital meter 63. A pulse duration modulator 64 responds to digout1 to supply pulses of corresponding duration as a signal pdm1 to a D'Arsonval meter 65. Similarly, a pulse duration modulator 66 responds to digout2 to supply pulses of corresponding duration as a signal pdm2 to another D'Arsonval meter 67.

Figure 2:
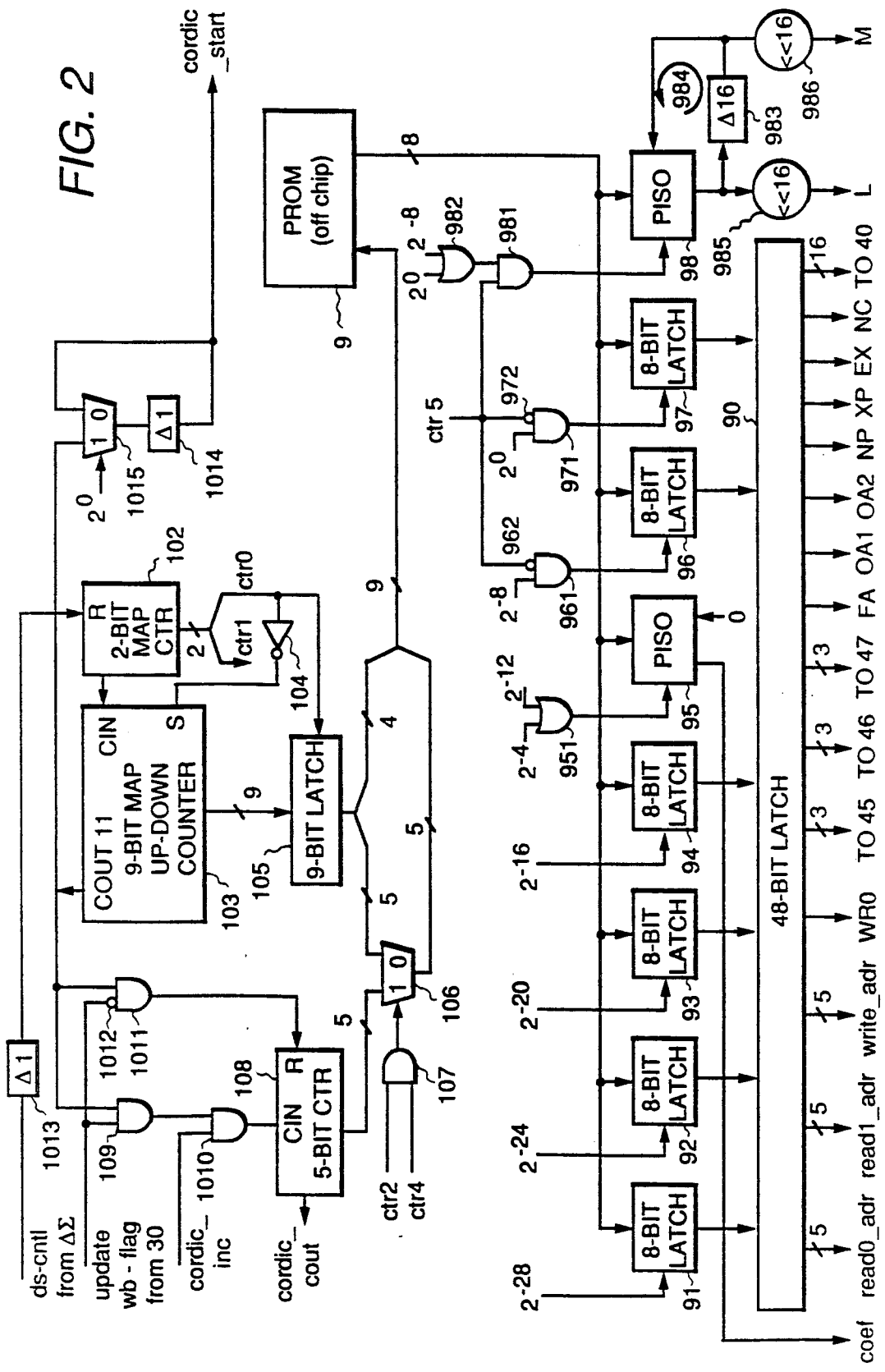
FIG. 2 is a schematic diagram of a portion of the control circuitry for the FIG. 1 power metering system, including counter circuitry used for generating the filter kernels for the plural-channel decimation filter embodying the invention.

FIG. 2 shows the PROM control circuitry 29 and portions of the clock generator 100 on the power metering i-c 5 in greater detail, and connections of the PROM control circuitry 29 to the off-chip PROM 9.

An eleven-stage master counter in the clock generator 100 counts at four times the oversampling rate in the sigma-delta modulators 21–26. This eleven-stage master counter comprises a two-stage counter 102 generating a 2-parallel-bit relatively less significant count output and a further nine-stage counter 103 counting the overflow bits from the counter 102 and generating a 9-parallel-bit relatively more significant count output. The nine-stage counter 103 is of an up-down type in which the 9-parallel-bit count output can be selectively two's complemented, and such selective complementing is done responsive to the complement of the least significant bit of the count output of the counter 102, which complement is furnished via a logic inverter 104 as the signal saw to the decimation filter 20 of FIG. 1, which filter 20 is described in detail further on with reference to FIG. 7. This selective two's complementing is done so the 9-parallel-bit relatively more significant count output and its complement can be used as the rising and falling portions, respectively, of the triangular filter coefficients in the six-channel decimation filter 20, which is more specifically described in connection with FIG. 7.

The ds_cntl signal, generated at a 2.5 MHz rate by the sigma-delta modulators 21–26 each time their outputs are updated, is applied as a reset signal to the counter 102 to establish synchronization between the multiply-add processor 30 and the sigma-delta modulators 21–26.

Responsive to the least significant bit of the count output of the counter 102 being ONE, a 9-bit-wide parallel-bit latch 105 latches the up-count portion of counter 103 count output. The contents of latch 105 are used to address PROM 9 to access programmed instructions for the multiply-add processor 30. That is, the nine-stage counter 103 serves as the program counter for addressing the PROM 9 to read sequentially the programmed instructions for the multiply-add processor 30, on a continuing, cyclical basis. The four least significant bits temporarily stored in the latch 105 are forwarded directly to PROM 9 as address bits for accessing bytes in the 16-byte unit shown in FIG. 3. A multiplexer 106 selectively transmits the five most significant bits temporarily stored in the latch 105 to PROM 9 as address bits, responsive to a ZERO control signal being received from an AND gate 107.

The AND gate 107 supplies a ONE output signal only during the fifth, seventh, thirteenth and fifteenth bytes of PROM 9 output, responsive to both ctr2 and ctr4 signals being high. The ctr2 and ctr4 signals are the up counts from the second and fourth stages, respectively, of the master counter comprising counters 102 and 103, as obtained from the 9-bit latch 105. Responsive to a ONE control signal being received from the AND gate 107, the multiplexer 106 selectively transmits to PROM 9 as address bits the 5-parallel-bit count output of a counter 108. The PROM 9 is considered to have a three-bit-interval latency.

AND gates 109 and 1010 AND the cout11 overflow from the counter 103 with the update_wb flag (as generated in the FIG. 11 circuitry) and a cordic_inc signal to generate the ONEs the five-stage counter 105 counts. The cordic_inc signal is a flag bit included in every instruction of the program for CORDIC processor 40, which flag bit is a ONE for every instruction but the last and then is a ZERO to halt the counter 108 at its full count. Accordingly, until the last instruction of the program for CORDIC processor 40, the counter 103 advances its count once every 2048 counts of the master counter comprising counters 102 and 103. The update_wb flag is complemented by the logic inverter 1012, and the complement is supplied to an AND gate 1011 as one of its input signals. The other input signal to the AND gate 1011 is the counter 103 overflow. If counter 103 overflow occurs other than when the update_wb flag is ONE, the AND gate 1011 will supply a ONE to reset the counter 108 to zero count.

ONEs indicating the clock cycle when the output signals from the sigma-delta modulators 21–26 are making their transitions are delayed one bit-serial clock delay in a clocked delay stage 1013 and applied as reset signal to the two-stage counter 102, so the count conditions in the counters 102 and 103 are synchronized therefrom.

The final carry-out cout11 of the master counter comprising counters 102 and 103, which occurs after count 2047 is reached, is selected to the input port of a clocked delay stage 1014 by a multiplexer 1015, responsive to bit-serial 2° applied as its control signal being a ONE. During the next thirty-one bit intervals, when its control signal is ZERO, the multiplexer 1015 selects to the input port of the single-bit-delay clocked delay stage 1014 the signal from its output port, in a latching operation. The signal from the output port of the clocked delay stage 1014 is the cordic_start signal used by circuitry shown in FIGS. 9, 11, 13 and 15. This signal is high during the initial, zeroeth instruction of each cycle of sixty-four MAP instructions that is supplied to the multiply-add processor 30.

FIG. 3 diagrams the layout of the sixteen eight-bit bytes of information stored in the NEC μPD28C04 used as the PROM 9. The FIG. 2 circuitry successively extracts the sixteen bytes of stored program and coefficient information from the PROM 9, in the order shown in the FIG. 4 timing diagram. This reading of the PROM 9 will now be described in greater detail, referring to FIG. 2.

FIG. 3 shows a 48-bit latch 90 that receives as its input signals output signals from eight-bit latches 91, 92, 93, 94, 96 and 97. (The 48-bit latch 90 does not actually appear in the monolithic i-c's presently being fabricated, since the timing of each control signal is independently derived by the silicon compiler, but is a convenient fiction to help human minds to understand the operation of the i-c.) The zeroeth and eighth of the sixteen eight-bit bytes sequentially and cyclically read from PROM 9 are latched in the eight-bit latch 91, responsive to bit-serial $2^{-28}$; the first and ninth of the sixteen eight-bit bytes sequentially and cyclically read from PROM 9 are latched in the eight-bit latch 92, responsive to bit-serial $2^{-24}$; the second and the tenth of the sixteen eight-bit bytes sequentially and cyclically read from PROM 9 are latched in an eight-bit latch 93, responsive to bit-serial $2^{-20}$; and the third and eleventh of the sixteen eight-bit bytes sequentially and cyclically read from PROM 9 are latched in the eight-bit latch 94, responsive to bit-serial $2^{-16}$.

The fifth of the sixteen eight-bit bytes sequentially and cyclically read from PROM 9 are latched in the eight-bit latch 96, responsive to a latch instruction received thereby; and, responsive to another latch instruction eight bit intervals later, the eight-bit latch 97 latches the seventh of the sixteen eight-bit bytes sequentially and cyclically read from PROM 9. The latch instructions for latches 96 and 97 are shown as being provided from the output ports of AND gates 961 and 971, respectively. The AND gate 961 output signal goes to ONE when both bit-serial $2^{-8}$ and the output signal from a logic inverter 962 are ONEs. The AND gate 971 output signal goes to ONE when both bit-serial $2^0$ and the output signal from a logic inverter 972 are ONEs. The output signals from the logic inverters 962 and 972 go to ONE when ctr5 goes to ZERO. The ctr5 signal is the output signal during up count from the fifth (numbering from zeroeth) stage of the counter comprising counters 102 and 103, as latched in the latch 105.

Forty-eight bits are assumed to be temporarily stored in latch 90. Bits 0-4 in the output signal of latch 90 are applied to the RAM 6 (not shown in FIG. 2) as its read0 address read0_adr; bits 5-9 in the output signal of latch 90 are applied to the RAM 6 as its read1 address read1_adr; and bits 10-14 in the output signal of latch 90 are applied to the RAM 6 as its write address write_adr. Bit 15 is the WR0 flag, which goes high to direct the writing of RAM 6 with its read_0 output. Bits 16-18 are the control signals for the multiplexer 45. Bits 19-21 are the control signals for the multiplexer 46. Bits 22-24 are the control signals for the multiplexer 47. Bits 25-28 are the load flags FA, OA1, OA2, and NP, respectively. Bit 29 is the XP flag. Bit 30 is the EZ flag. Bit 31 is unused. Bits 32-39, latched into the latch 90 from latch 96, are supplied to the cordic processor 40 as instruction CC0. Bits 40-47, latched into the latch 90 from latch 97, are supplied to the cordic processor 40 as instruction CC1.

The fourth, sixth, twelfth, and fourteenth of the sixteen eight-bit bytes sequentially and cyclically read from PROM 9 are loaded in parallel into a parallel-in/serial-out register 95, which has 8-bit temporary storage capability for the coef signals to be supplied to the multiply-add processor 30. An OR gate 951 supplies a ONE responsive to bit-serial $2^{-12}$ for commanding the loading of the fourth and twelfth of the sixteen eight-bit bytes sequentially read from PROM 9 into the SIPO register 95, as the initial portion of the coef signal made available to a multiplexer 46 (shown in FIG. 9). The OR gate 951 also supplies a ONE responsive to bit-serial $2^{-4}$ for commanding the loading of the sixth and fourteenth of the sixteen eight-bit bytes sequentially read from PROM 9 into the SIPO register 95, as the final portion of the coef signal made available to the multiplexer 46.

The thirteenth and fifteenth of the sixteen eight-bit bytes sequentially and cyclically read from PROM 9 are loaded in parallel into a parallel-in/serial-out register 98, responsive to an AND gate 981 supplying a ONE, responsive to ctr5 signal going to ONE at the same time as the output signal of an OR gate 982. The output signal of the OR gate 982 goes to ONE responsive to either bit-serial $2^0$ or bit-serial $2^{-8}$ being a ONE. The bit-serial signal from the serial output port of the parallel-in/serial-out register 98 is applied to the input port of a 16-bit clocked delay line 983, which has its output port connected back to the serial input port of the PISO register 98 to form a circulating serial-memory loop 984. This circulating serial-memory loop 984 supplies at the output port of the clocked delay line 983 the thirteenth and fifteenth eight-bit bytes from PROM 9 as temporarily stored in the circulating serial-memory loop 984, in parallel with the current thirteenth and fifteenth eight-bit bytes from PROM 9 as read directly from the parallel-in/serial-out register 98. Each successive pair of thirteenth and fifteenth eight-bit bytes from PROM 9 is read from the parallel-in/serial-out register 98 to a shifter circuit 985 that shifts those sixteen bits to sixteen bits greater significance, filling sixteen ZEROs before those bits and discarding the sixteen succeeding bits, thereby generating an L coefficient utilized by the normalizer 39. At the same time each successive pair of thirteenth and fifteenth eight-bit bytes from PROM 9 are read from the delay line 983 to a shifter circuit 986 that shifts those sixteen bits to sixteen bits greater significance, filling sixteen ZEROs before those bits and discarding the sixteen succeeding bits, thereby generating an M coefficient utilized by the normalizer 39. Accordingly, L is the value of the coefficient in the current CORDIC instruction, and M is is the value of the coefficient in the previous CORDIC instruction as iterated by being cycled once around the loop 984. (How the normalizer 39 utilizes the L and M coefficients is described in detail further on in this specification, with reference to FIG. 9.)

Figure 5:
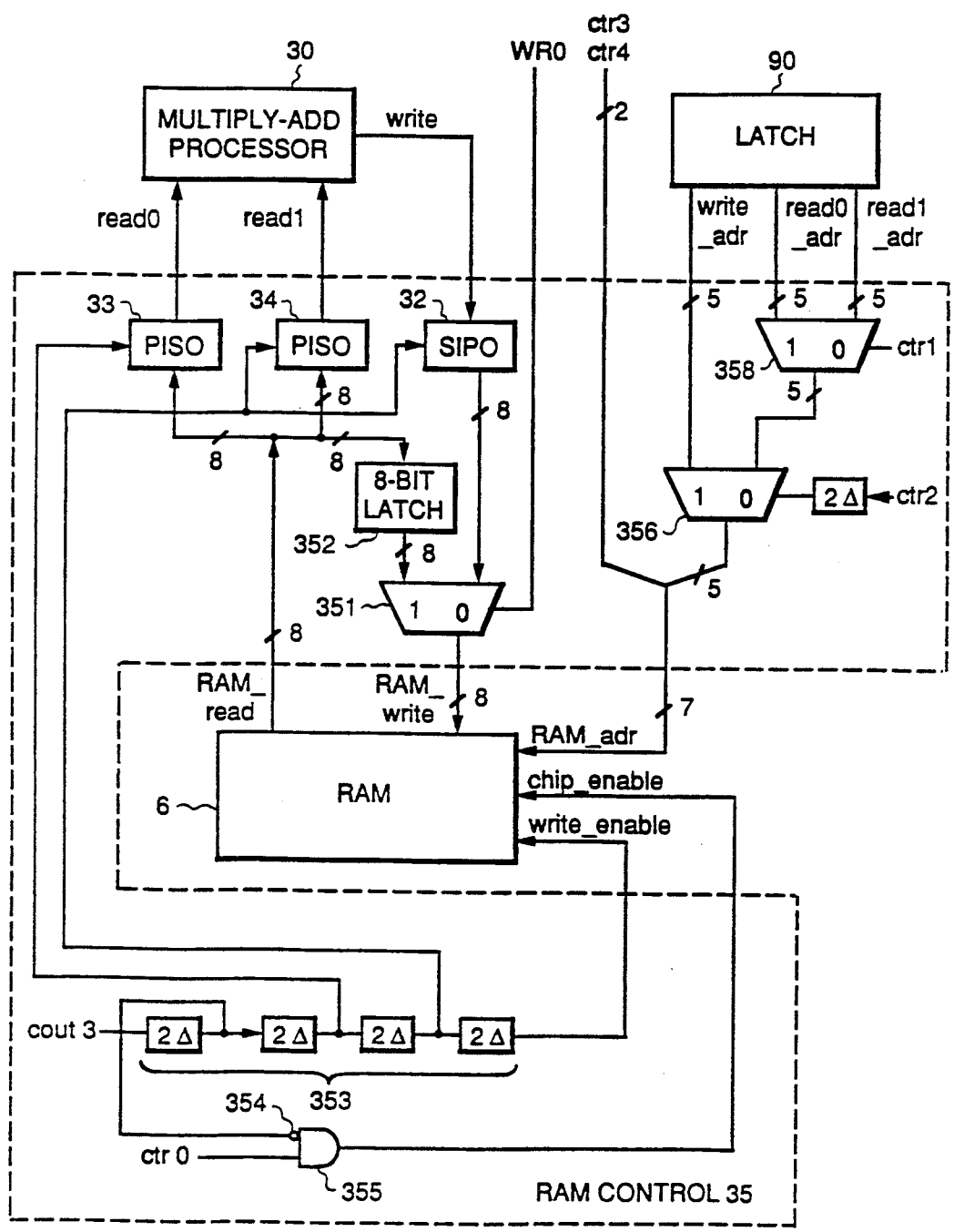
FIG. 5 is a schematic diagram of another portion of the control circuitry in the FIG. 1 power metering system, including circuitry for interfacing with the random-access memory.

FIG. 5 shows in greater detail the RAM control circuitry 35 and its interconnections to the RAM 6, the serial-in/parallel-out register 32 and the parallel-in/serial-out registers 33 and 34. The connections of the multiply-add processor 30 to the registers 32, 33 and 34 are also shown. The connection of the SIPO register 32 to the write input port of the RAM 6 is shown to be made selectively via a multiplexer 351 responsive to the WR0 flag in the multiply-add processor 30 instruction being ZERO. When the WR0 flag is a ONE, the multiplexer 351 selects to the RAM 6 as its write input its read0 output as read out two bits previously and temporarily stored in an eight-bit-wide, parallel bit latch 352.

Figure 6:
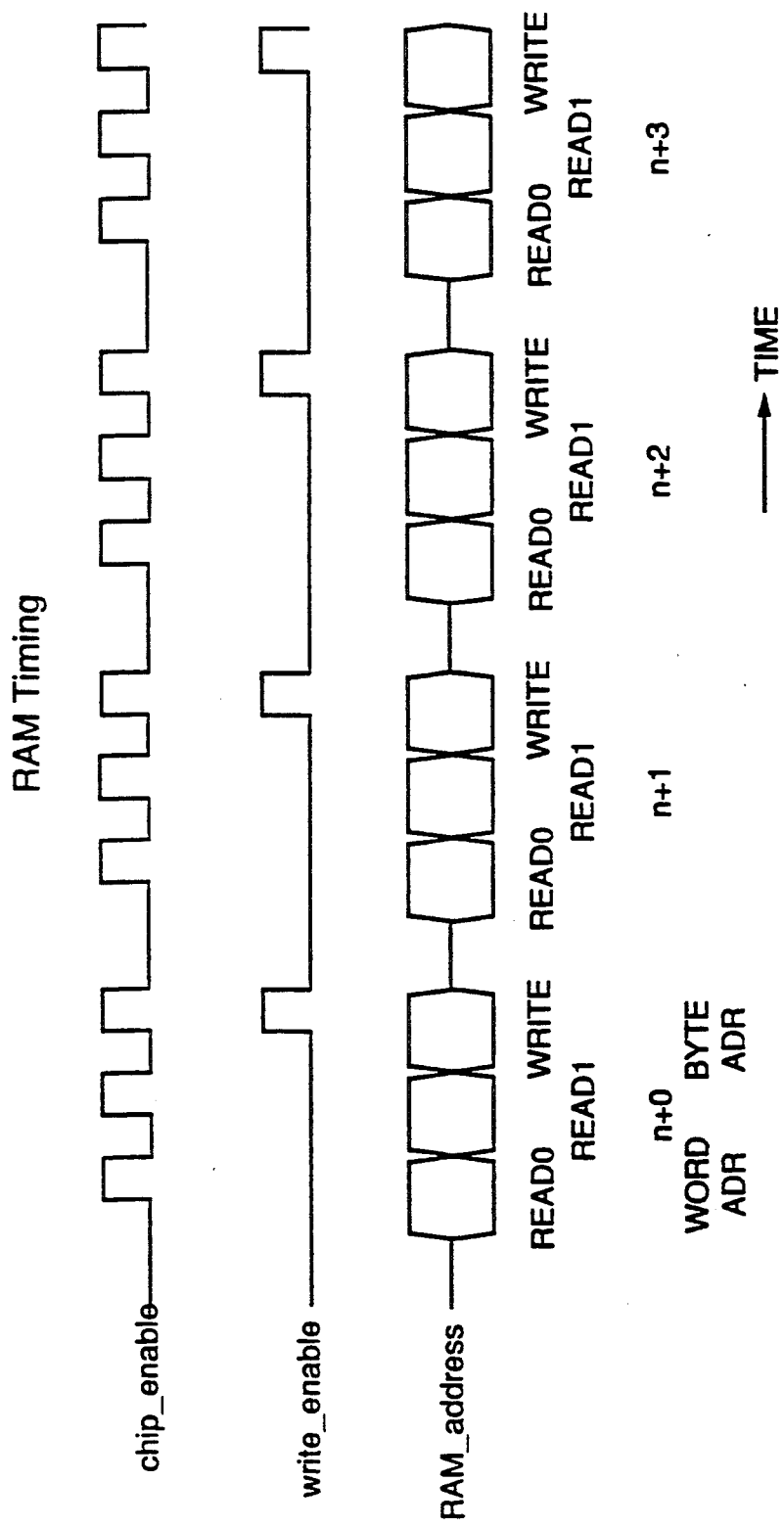
FIG. 6 is a timing diagram of the operation of the random-access memory.

As shown in the FIG. 6 timing diagram for the RAM 6, in each cycle of RAM operation, the READ0, READ1 and WRITE accesses to the RAM 6 are carried out sequentially during respective ones of the four successive counts of the initial stage of counter 102. The READ0, READ1 and WRITE accesses are preceded by another count in the 4-count cycle of the counter 102 when the RAM 6 is not accessed. A cout3 signal supplied from the counter 103 (of FIG. 2) responsive to overflow indications from the initial stage of the counter 102 (of FIG. 2) is delayed for 2-bit, 4-bit, 6-bit and 8-bit durations in a clocked delay line 353 to generate, respectively, an input signal to a logic inverter 354, load instructions for the PISO register 33 and the latch 352, load instructions for the SIPO register 32 and the PISO register 34, and the write_enable signal applied to the RAM 6 during the WRITE access. A chip_enable signal is supplied from an AND gate 354 to the RAM 6 during each of the READ0, READ1 and WRITE accesses. The two-input AND gate 355 responds to the ctr0 signal applied as one of its input signals going to ONE at the same time the output signal from the logic inverter 354 goes to ONE, which occurs two bit durations after the ctr3 signal goes to ZERO.

A multiplexer 356 is controlled by the ctr2 signal from the counter 102 as delayed by a two-bit interval in a clocked delay line 357. Two bit intervals after the ctr2 signal from the counter 102 goes to ONE, the multiplexer 356 selects the 5-bit write_adr signal from the latch 90 to be applied to the RAM 6 together with the ctr3 and ctr4 outputs taken from the counter 103. The multiplexer 356 responds to the ctr2 signal, as delayed for two bits duration in the clocked delay line 357, being a ZERO to select the 5-bit wide output signal from a multiplexer 358 to be applied to the RAM 6 together with the ctr3 and ctr4 outputs from the counter 103 as the 7-bit (read) address for RAM 6. The multiplexer 358 responds to the ctr1 signal from the counter 102 being a ONE to select to its output port the 5-bit read0_adr signal from the latch 90. The multiplexer 358 responds to the ctr1 signal from the counter 102 being a ZERO to select to its output port the 5-bit read1_adr signal from the latch 90.

Figure 7:
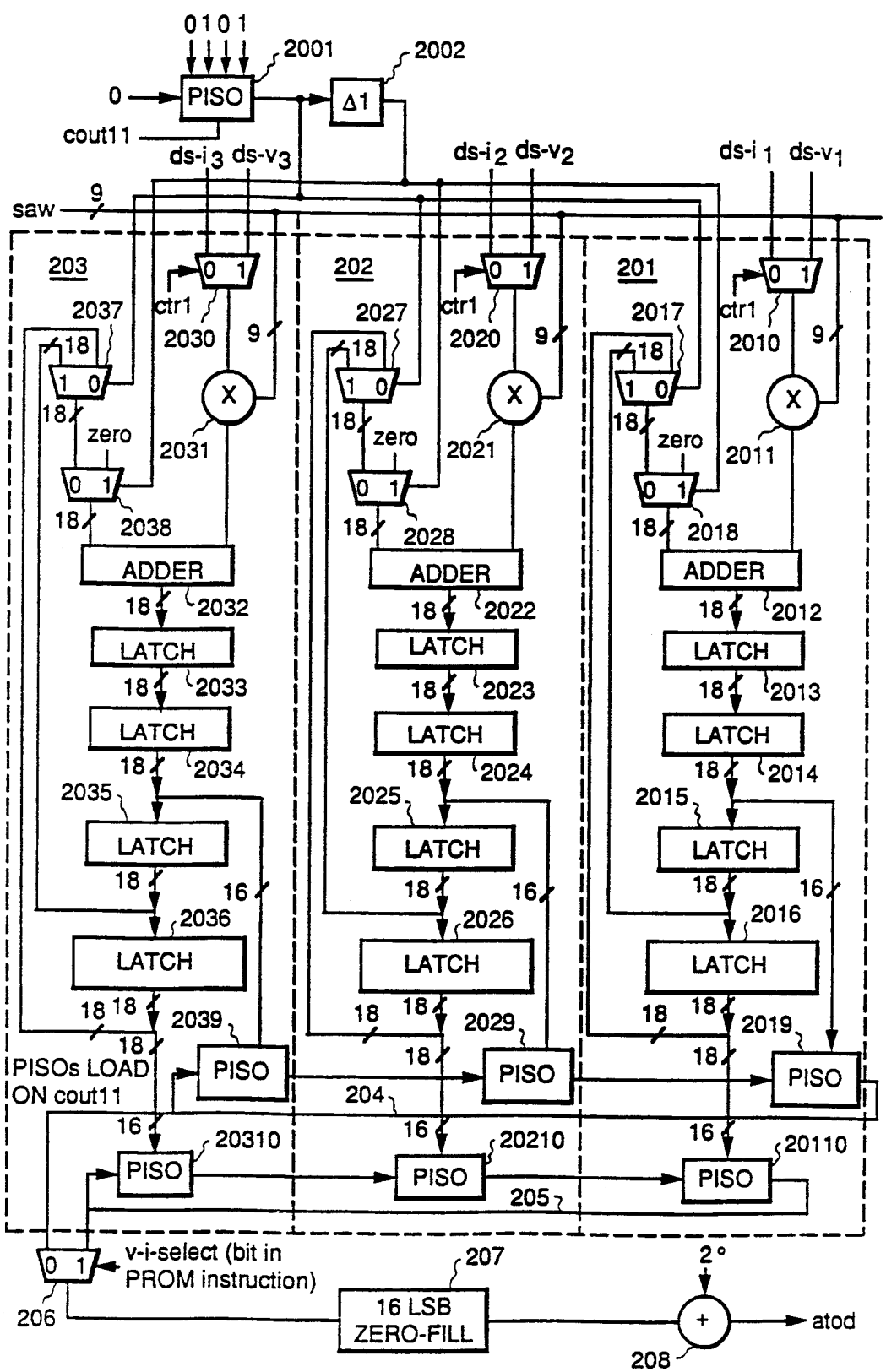
FIG. 7 is a schematic diagram of the plural-channel decimation filter used between the oversampling analog-to-digital converters and the digital signal processor cascade in FIG. 1, which plural-channel decimatioin filter embodies the invention.

FIG. 7 shows the six-channel decimation filter 20 in greater detail. The output samples ds-$i_1$ from the sigma-delta modulator 21 and the output samples ds-$v_1$ from the sigma-delta modulator 24 are filtered on a time-division-multiplexed basis by decimation filter channel 201. The decimation filter channel 201 includes a multiplexer 2010 that responds to the count output ctr1 from the less rapidly changing more-significant-bit output from the two-stage counter 102 (of FIG. 2) to select between the output samples ds-$i_1$ from the sigma-delta modulator 21 and the output samples ds-$v_1$ from the sigma-delta modulator 24.

The selected signal is supplied from the multiplexer 2010 as a stream of bits, each successive single bit of which stream is used as the multiplier signal for a multiplier 2011 that receives a bit-parallel multiplicand signal saw from the nine-stage counter 103 (of FIG. 2), which counter counts the overflow from the two-stage counter 102. The multiplier 2011 comprises a plurality of AND gates receiving as their respective first input signals the respective bits of the saw signal and receiving as their respective second input signals the respective bits of the multiplexer 2010 output signal. The saw signal is the positive up count from the nine-stage counter 103 when the count output ctr0 generated by the more rapidly changing less-siignificant-bit output from the two-stage counter 102 is a ONE; when the count output ctr0 generated by the more rapidly changing less-significant-bit output from the two-stage counter 102 is a ZERO, the saw signal is the negative down count from the nine-stage counter 103. This facilitates the interleaved accumulations of input signal samples as convolved with a set of rising triangular coefficients and as convolved with a set of falling triangular coefficients.

The parallel-bit products of ds-$i_1$ convolved with the falling filter coefficients, of ds-$i_1$ convolved with the rising filter coefficients, of ds-$v_1$ convolved with the falling filter coefficients, and of ds-$v_1$ convolved with the rising filter coefficients are supplied on a time-division-multiplexed basis from the multiplier 2011 to a parallel-bit digital adder 2012 as its addend signal. The digital adder 2012 supplies its sum output to a cascade of word latches 2013, 2014, 2015 and 2016. The word latches 2013, 2014, 2015 and 2016 clock their contents forward at the clocking rate of the counter 102 (of FIG. 2). During the time-division-multiplexed accumulations involving the digital adder 2012, multiplexers 2017 and 2018 select the output signal from the latch 2016 to the adder 2012 as its augend input signal.

The cout11 overflow indication going to ONE is used as a load instruction to condition a parallel-in/serial-out stage 2019 to load itself from latch 2014 contents, the convolution of the ds-$v_1$ samples with a complete set of triangular filter coefficients. The cout11 overflow indication going to ONE also is used as a load instruction to another parallel-in/serial-out stage 20110 to load itself from latch 2016 contents, the convolution of the ds-$i_1$ samples with a complete set of triangular filter coefficients.

A parallel-in/serial-out register 2001 is loaded through its parallel-bit input port with a 0101 parallel-bit signal responsive to cout11 overflow indication from the counter 103 (of FIG. 2) being ONE as maximum count is reached. A serial-bit input port of the PISO register 2001 is supplied with ZERO input. After the cout11 overflow indication returns to ZERO, the SIPO register 2001 supplies a 1010 bit sequence followed by ZEROs until cout11 overflow indication next goes to ONE. This output signal from the PISO register 2001 controls the selection made by the multiplexer 2017. This output signal from the PISO register 2001 is delayed by one clock interval in a clocked latch 2002 to generate the signal that controls the selection made by the multiplexer 2018.

On the first clock cycle following the cout11 overflow indication being ONE, the final result of the accumulation of ds-i1 convolved with rising filter coefficients stored in the latch 2015 is selected by the multiplexer 2017 to the augend input of adder 2012 to pre-condition the accumulation to ds-i1 convolved with falling filter coefficients. On the second clock cycle following the cout11 overflow indication being ONE, arithmetic zero is selected by the multiplexer 2018 to the input port of adder 2012 to pre-condition the accumulation of ds-i1 convolved with rising filter coefficients. On the third clock cycle following the cout11 overflow indication being ONE, the final result of the accumulation of ds-v1 convolved with rising filter coefficients stored in the latch 2015 is selected by the multiplexer 2017 to the augend input of adder 2012 to pre-condition the accumulation of ds-v1 convolved with falling filter coefficients. On the fourth clock cycle following the cout11 overflow indication being ONE, arithmetic zero is again selected by the multiplexer 2018 to the input of adder 2012 to pre-condition the accumulation of ds-v1 convolved with rising filter coefficients.

The output samples ds-i$_2$ from the sigma-delta modulator 22 and the output samples ds-v$_2$ from the sigma-delta modulator 25 are filtered on a time-division-multiplexed basis by decimation filter channel 202. Elements 2020–2029 and 20210 in the decimation filter channel 202 correspond to respective ones of the elements 2010–2019 and 20110 in the decimation filter channel 201. The output samples ds-i$_3$ from the sigma-delta modulator 23 and the output samples ds-v$_3$ from the sigma-delta modulator 26 are filtered on a time-division-multiplexed basis by decimation filter channel 203. Elements 2030–2039 and 20310 in the decimation filter channel 202 correspond to respective ones of the elements 2010–2019 and 20110 in the decimation filter channel 201. The multiplexers 2027 and 2037 are, like the multiplexer 2017, controlled by the output signal from the PISO register 2001; and the multiplexers 2028 and 2038 are, like the multiplexer 2018, controlled by the output signal from the clocked latch 2002. The parallel-in/serial-out stages 2039, 2029 and 2019 are connected in a loop 204 of bit-serial memory. The parallel-in/serial-out stages 20310, 20210 and 20110 are connected in another loop 205 of bit-serial memory. A multiplexer 206 responds to a v-i-select bit in the multiply-add processor 30 instructions, as furnished from the PROM 9, to select sixteen-bit chunks from one of the bit-serial memory loops 204 and 205 for reading to circuitry 207, which precedes each of these chunks with sixteen fill ZEROs to form a 32-bit data word forwarded to a bit-serial adder 208 as its addend input signal. The adder 208 receives bit-serial 2$^0$ as its augend input, so it provides a two's complement signed 32-bit data word responsive to the uni-polarity 32-bit data word received as its addend input signal.

Figure 8:
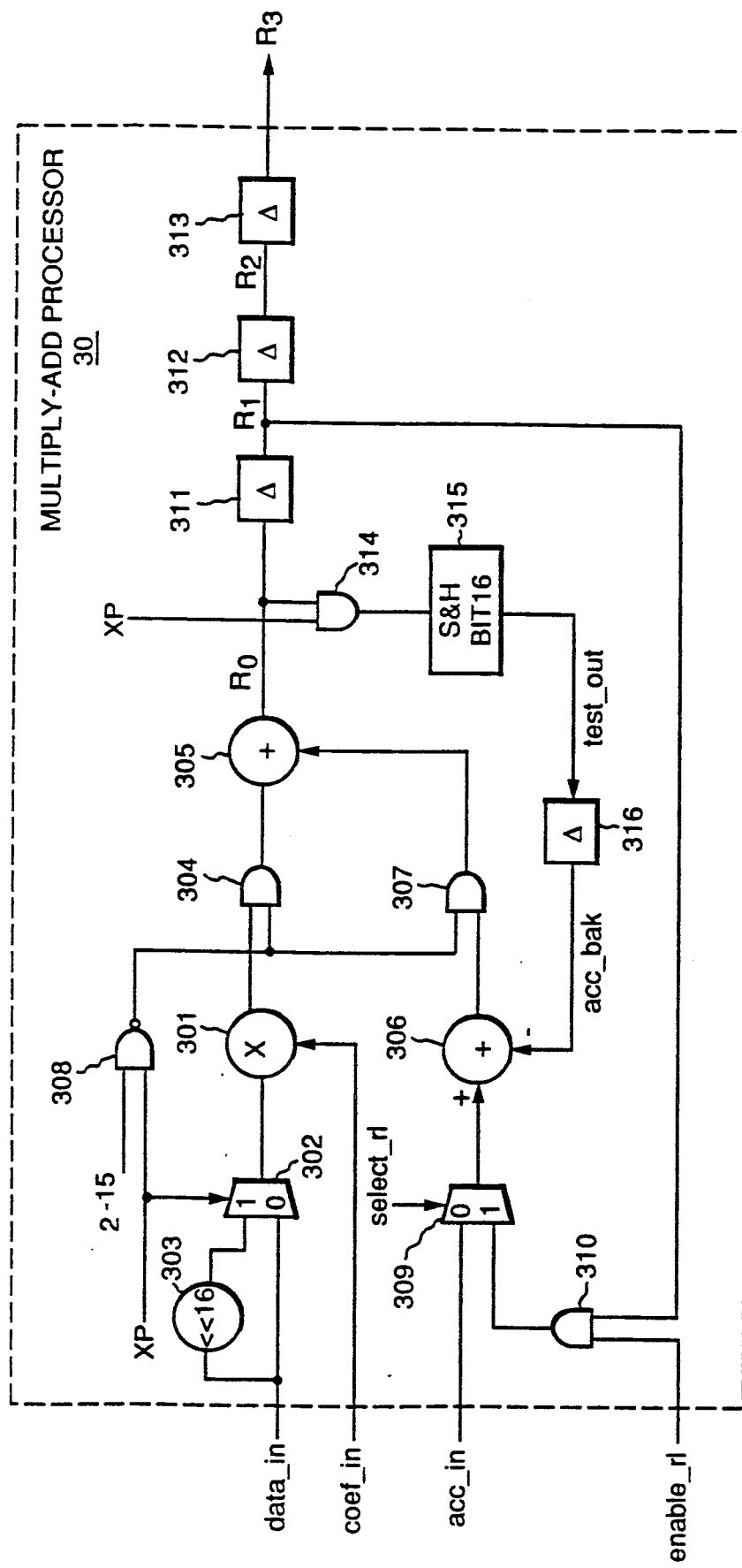
FIG. 8 is a schematic diagram of the bit-serial multiply-add processor that is the initial processor in the FIG. 1 digital signal processor cascade.

FIG. 8 shows the multiply-add processor 30 in greater detail. A select-R$_1$ signal, an enable-R$_1$ signal and an XP signal are each what is termed a "logic signal". A "logic signal" is a signal, usually used for control purposes, that is constant during a bit-serial word, 32 clock cycles in the case of the power metering i-c 5. The constant 2$^{-15}$ is a bit-serial word which has only its bit 16 set high to a ONE, where the least significant bit is bit 0.

A bit-serial multiplier 301 receives a bit-serial coef(-ficient)_in as a multiplicand signal. Its bit-serial multiplier signal is received from the output port of a two-input multiplexer 302 that receives a bit-serial data_in signal at one of its input ports and that receives at the other of its input ports the data_in signal as multiplied by 2$^{16}$ in a left shifter 303 which is implemented by a sixteen-binary-place shift towards more significance and zero-filling. The bit-serial product from the bit-serial multiplier 301 is selectively applied via an AND gate 304 as addend input signal to a bit-serial adder 305. The bit-serial difference output signal from a bit-serial subtractor 306 is selectively supplied via an AND gate 307 as the bit-serial augend input signal for the bit-serial adder 305. A NAND gate 308 outputs a ONE that conditions the signal at the AND gate 304 output port to be the same as the bit-serial product from the multiplier 301 and that conditions the signal at the AND gate 307 output port to be the same as the bit-serial difference output signal from the subtractor 306 except when bit 16 occurs at the same time the logic signal XP is high in extended-precision processing. The logic signal XP is a flag signal that is a portion of certain of the programmed instructions for the multiply-add processor 30. A two-input multiplexer 309 applies a bit-serial acc(umulator)_in signal as minuend input signal to the subtractor 306, except during certain accumulations when a select-R$_1$ signal supplied to the multiplexer 308 is a ONE causing it to select to its output port the bits appearing serially from the output port of an AND gate 310.

The bit-serial sum output signal R$_0$ from the adder 305 is the input signal for a one-word-length clocked delay line 311 that generates a bit-serial signal R$_1 = \Delta R_0$. The bit-serial sum output signal R$_1$ from the clocked delay line 311 is supplied as one of the two input signals to the AND gate 310, the other input thereto being the enable-R$_1$ logic signal. The bit-serial sum output signal R$_1$ from the clocked delay line 311 is the input signal for a one-word-length clocked delay line 312 that generates a bit-serial signal R$_2 = \Delta R_1$. The bit-serial sum output signal R$_2$ from the clocked delay line 312 is the input signal for a one-word-length clocked delay line 311 that generates a bit-serial signal R$_3 = \Delta R_2$.

The bit-serial sum output signal R$_0$ from the adder 305 is applied to one input port of an AND gate 314, the other input port of which receives the XP logic signal. The output port of the AND gate 314 is supplied to a sample-and-hold circuit 315 that puts out a logic signal according to the state of bit 16 of its input signal, in which the least significant bit is bit 0. The logic signal from the output port of the AND gate 314 is delayed for the duration of one bit-serial word before being applied to the subtrahend input port of the bit-serial subtractor 306.

Normally (the input logic signals all set to ZERO), the multiply-add processor 30 multiplies data_in and coef_in signals to produce a product which is added to acc_in signal. The bit-serial multiplier 301 is built from sixteen coefficient slices, so only the sixteen most significant bits of the coefficient are used in the multiplication. The output of the bit-serial multiplier is a 32-bit bit-serial word which is equivalent to the thirty-two most significant bits of the 47-bit complete product of the 32-bit-per-word data_in word and the 16-bit-per-word coef_in signal, both of which signals are signed numbers in two's complement representation. The fifteen least significant bits of the product are discarded in the internal circuitry of the bit-serial multiplier 301.

In extended precision mode, the flag signal XP supplied as a part of the current programmed instruction for the processor 30 is set high during the first word of each successive two-word operation. The signals data_in and coef_in must be repeated during both words, while the signal acc_in and the multiplier output are the least significant (first word) and most significant (second word) portions of a two-word quantity. When XP is high, the data input to the multiplier 301 selected by the multiplexer 302 is data_in as pre-shifted to the left by sixteen bits and zero-filled by the left shifter 303. Therefore, during the first word of an extended precision operation, the output of the multiplier 301 is similar to that obtained by discarding the sixteen most significant bits of the 47-bit complete product instead of the fifteen least significant bits. However, owing to misinterpretation of the sign bit of the data word by the multiplier 301, only the sixteen least significant bits are valid. To summarize, the output of the multiplier 301 during the first word will have a ZERO as least significant bit, followed by the fifteen least significants of the 47-bit complete product, followed by sixteen "garbage" bits.

When the multiplier output is added to the least-significant word from acc—in, AND gates 304 and 307 are operative to mask bit 16 of both the addend and augend inputs of adder 305 responsive to the NAND gate 308 output signal being ZERO because of XP and $2-15$ being simultaneously high. Therefore, bit 16 of the adder 305 sum output is equivalent to the carry bit from the addition of the sixteen least significant bits, i.e., the valid portion of the word. This bit is sampled and held by a sample-and-hold circuit 315 to produce the logic signal test—out, which is delayed in a clocked latch 316 to generate a logic signal acc-bak for use in the following word.

During the second word of an extended precision operation, XP logic signal is zero. In fact, there is no apparent difference between a single-precision operation and the second word of an extended-precision operation. As previously stated the data—in and acc—in input signals from the previous word should be repeated, and the more significant word of a two-word acc—in should now be applied. If the less significant portion of the two-word operation yielded a carry, the logic signal acc—bak will be high during the most significant portion of the extended precision operation. The logic signal acc—bak is subtracted from acc—in. Since, a high logic signal has a two's complement value of $-1$, a carry from the least significant word causes the most significant word to be incremented. A logic signal of ZERO has a two's complement value of zero; thus, when there is no carry from the least significant word, the second word is unaffected.

The net effect of the extended-precision operation is that the complete 47-bit product of the data—in and coef—in signals is preserved in the accumulation. The dynamic range of the accumulator is also forty-seven bits, since the least significant bit and the sixteen most significant bits of the least significant word are not useful.

Figure 9:
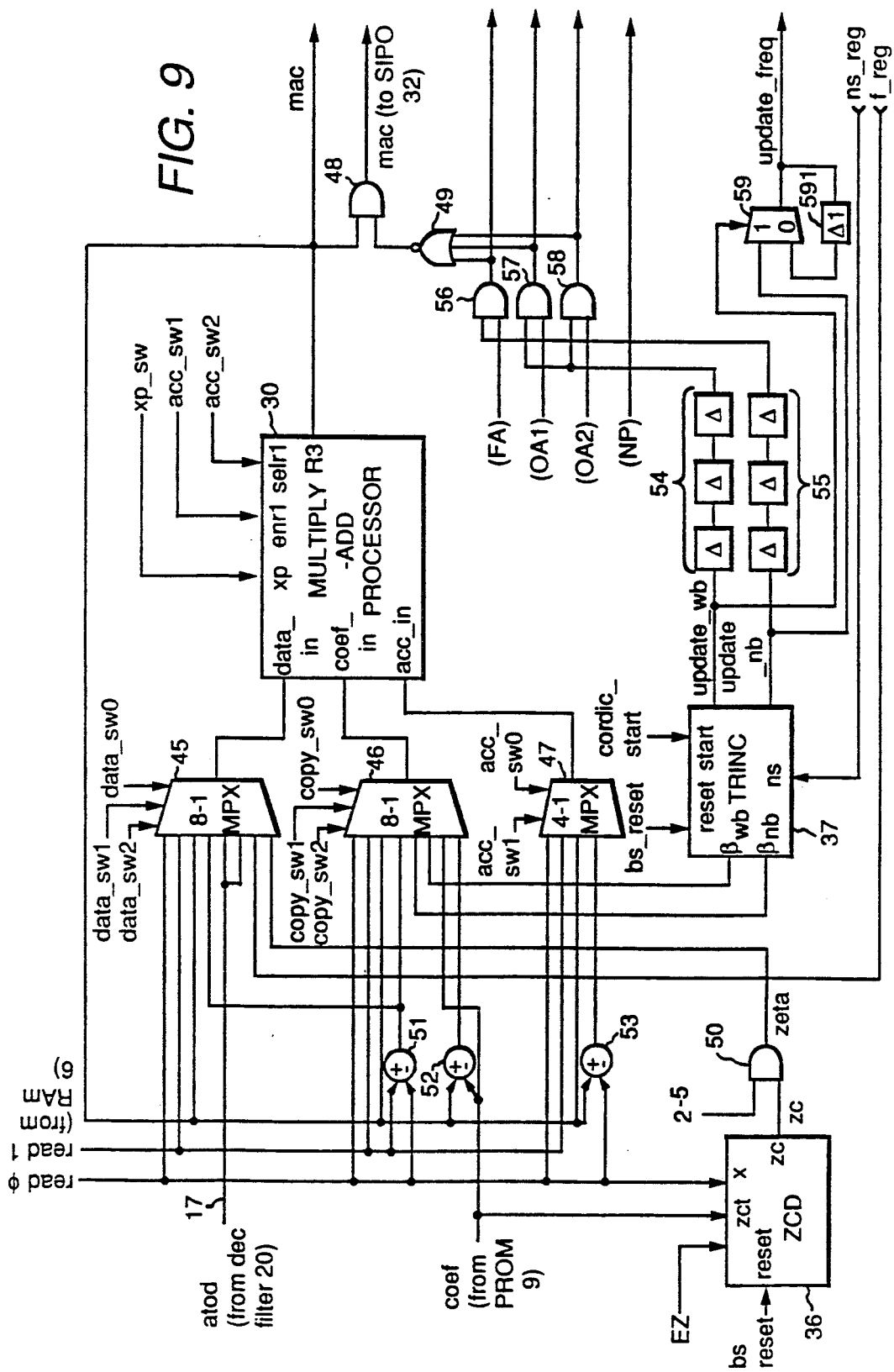
FIG. 9 is a schematic diagram showing the connections of the FIG. 8 bit-serial multiply-add processor to other elements in the FIG. 1 power metering system.

FIG. 9 shows in greater detail the connections of the multiply-add processor 30 to other circuitry. An eight-input multiplexer 45 selects the data—in signal applied to the multiply-add processor 30. The bit-serial data—in signal can be selected from:

(000) a read—0 signal supplied from RAM 6 via the PISO register 33, (001) a read—1 signal supplied from RAM 6 via the PISO register 34, (010) the output signal of the multiply-add processor 30, (011) the difference between read—0 and read—1 signals from a subtractor 51, (100) the output signal of the decimation filter 20, (101) the output of the decimation filter 20, (110) an indication F of frequency drawn from a register 192 in the bank 19 of bit-serial registers, and (111) zero-crossing indications from an AND gate 50.

Another eight-input multiplier 46 selects the coef—in signal applied to the multiply-add processor 30. The bit-serial coef—in signal can be selected from:

(000) the read—0 signal supplied from RAM 6 via the PISO register 33, (001) the read—1 signal supplied from RAM 6 via the PISO register 34, (010) the output signal of the multiply-add processor 30, (011) the difference between read—0 and read—1 signals, as determined by the subtractor 51, (100) relatively high-frequency $sinc^2$ filter coefficients $\beta_{nb}$ from the triangular coefficient generator 37, (101) relatively low-frequency $sinc^2$ filter coefficients $\beta_{wb}$ from the triangular coefficient generator 37, (110) the coef signal from PROM 9 via the PISO register 95, and (111) the difference between the output signal of the multiply-add processor 30, and the coef signal supplied from PROM 9 via the PISO register 95, as determined by a subtractor 52.

A four-input multiplexer 47 selects the acc—in signal applied to the multiply-add processor 30. The bit-serial acc—in signal can be selected from:

(00) the read—0 signal supplied from RAM 6 via the PISO register 33,

(01) the read—1 signal supplied from RAM 6 via the PISO register 34,

(10) the output signal of the multiply-add processor 30, and

(11) the difference between the output signal of the multiply-add processor 30 and the read—0 signal supplied from RAM 6 via the PISO register 33, as determined by a subtractor 53.

Figure 16:
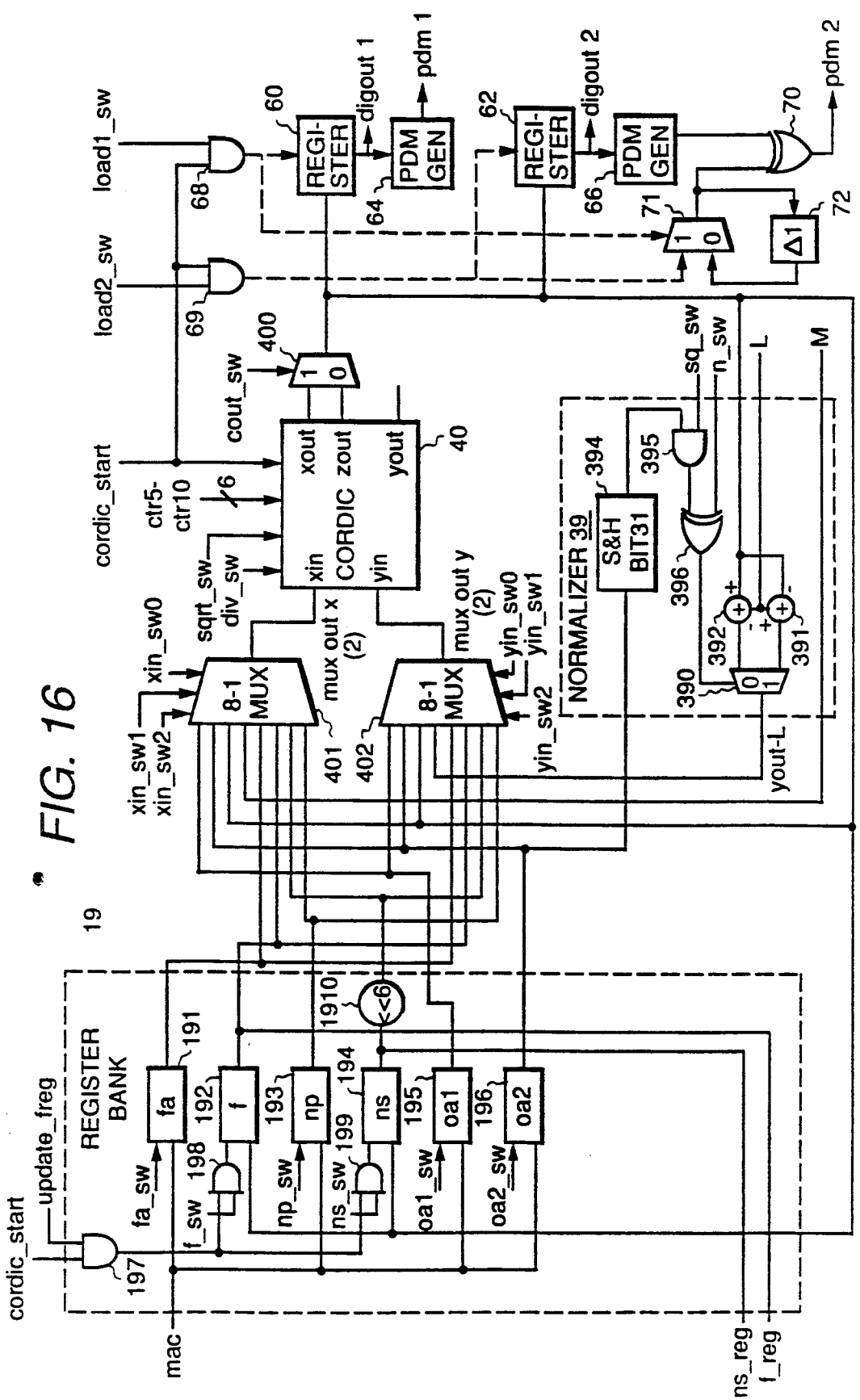
FIG. 16 is a schematic diagram showing the connections of the FIG. 13 bit-serial CORDIC processor to othe elements in the FIG. 1 power metering system.

In FIG. 16, the register bank 19 between the multiply-add processor 30 and the CORDIC processor 40 is shown as comprising component bit-serial registers 191-196. Each of these registers 191-196 is a 32-bit serial memory with the bits stored therein being cyclically available, one bit at a time for reading and one bit at a time for writing.

The bit-serial register 191 is used for storing $f_a$, the accumulated low-pass filtering result for frequency, as written to register 191 from the multiply-add processor 30 (in FIG. 9). As may be seen in FIG. 16, when the 100 input of the multiplexer 401 is selected, $f_a$ can be read to the CORDIC processor 40 as the xin input signal thereto; and when the 100 input of the multiplexer 402 is selected, $f_a$ can be read to the CORDIC processor 40 as the yin input signal thereto.

The bit-serial register 192 is used for storing f, the normalized signal frequency ($8f_{in}/f_s$), as written to register 192 from the CORDIC processor 40 (in FIG. 16) during updating. The contents of the bit-serial register 192 can be read and selected by the multiplexer 45 (in FIG. 9) as data—in signal for the multiply-add processor 30 (also in FIG. 9). As may be seen in FIG. 16, when the 101 input of the multiplexer 401 is selected, f can be read to the CORDIC processor 40 as the xin input signal thereto; and when the 101 input of the multiplexer 402 is selected, f can be read to the CORDIC processor 40 as the yin input signal thereto.

The bit-serial register 193 is used for storing $n_p$, the number of periods used in the kernel for low-pass filtering with the multiply-add processor 30, as written to register 193 from the multiply-add processor 30 (as shown in FIG. 16). Register 193 is loaded with $n_p$ from the output of processor 30 responsive to an NP flag appearing in the current instruction for the processor 30. As shown in FIG. 16, when the 111 input of the multiplexer 401 is selected, $n_p$ can be read to the CORDIC processor 40 as the xin input signal thereto; and when the 111 input of the multiplexer 402 is selected, $n_p$ can be read to the CORDIC processor 40 as the yin input signal thereto.

The bit-serial register 194 is used for storing $n_s$, which equals $n_p$ divided by f, is calculated by the CORDIC processor 40, and is written to register 194 from the CORDIC processor 40 during start-up or updating (as may be seen in FIG. 16). (At times, particularly in the drawing "$n_n$" appears as "ns".) The contents of the bit-serial register 194 are supplied to the triangular coeficient generator 37 (in FIG. 11). As may be seen in FIG. 16, when the 110 input of the multiplexer 401 is selected, $n_s$ as divided by $2^6$ in a shift-with-sign-extension circuit 400 can be read to the CORDIC processor 40 as the xin input signal thereto; and when the 110 input of the multiplexer 402 is selected, $n_s$ as divided by $2^6$ in the shift-with-sign-extension circuit 197 can be read to the CORDIC processor 40 as the yin input signal thereto.

Referring to FIG. 9, the bit-serial register 195 is used for storing $o_{a1}$, the accumulated low-pass filtering result for signals received by the multiply-add processor 30 from the decimation filter 20, to register 195 from the multply-add processor 30. As may be seen in FIG. 16, when the 000 input of the multiplexer 401 is selected, $o_{a1}$ can be read to the CORDIC processor 40 as the xin input signal thereto; and when the 000 input of the multiplexer 402 is selected, $o_{a1}$ can be read to the CORDIC processor 40 as the yin input signal thereto.

Referring to FIG. 9, the bit-serial register 196 is used for storing oa2, the accumulated low-pass filtering result for signals received by the multiply-add processor 30 from the decimation filter 20, as written to register 196 from the multiply-add processor 30. As may be seen in FIG. 16, when the 001 input of the multiplexer 401 is selected, oa2 can be read to the CORDIC processor 40 as the xin input signal thereto; and when the 001 input of the multiplexer 402 is selected, oa2 can be read to the CORDIC processor 40 as the yin input signal thereto.

Returning to considering FIG. 9 alone, a two-input AND gate 48 receives the output signal of the multiply-add processor 30 at one of its inputs and response to that signal for writing it to the RAM 6 when the other of its input signals is a ONE, as furnished from the output port of a three-input NOR gate 49. NOR gate 49 furnishes that ONE when there is absence of laod instruction to any of the bit-serial registers registers 191, 195 and 196 in the bank 19 of registers used to interface between the processors 30 and 40. NOR gate 49 responds with a ZERO to a load instruction being supplied to any of the bit-serial registers registers 191, 195 and 196 in the bank 19 of registers used to interface between the processors 30 and 40. This causes the addressed location in RAM 6 to be written with arithmetic zero.

As will be explained in more detail in connection with FIGS. 11 and 12, the triangular coefficient generator 37 issues an update_wb signal that pulses to ONE from its normal ZERO state each time a cycle of filter coefficients $2n_s$ in number is completed and an update_nb signal that pusles to ONE from its normal ZERO state each time a cycle of filter coefficients $8n_s$ in number is completed. The update_wb and the update_nb signals are each delayed for the duration of three bit-serial word (96 bits) in clocked delay lines 54 and 55, respectively, to provide control signals temporally aligned with the $R_3$ output signal of the multiply-add processor 30. Responsive to the delayed update_nb signal and an FA flag included in the current instruction for the processor 30 both being ONEs concurrently, an AND gate 56 issures a ONE as a load instruction to the bit-serial register 192 used for storing the value $f_a$ computed by the multiply-add processor 30. Responsive to the delayed update_wb signal and an OA1 flag included in the current instruction for the processor 30 both being ONEs concurrently, an AND gate 57 issures a ONE as a load instruction to the bit-serial register 195 used for storing the value $oa_1$ computed by the multiply-add processor 30. Responsive to the delayed update_wb signal and an OA2 flag included in the current instruction for the processor 30 both being ONEs concurrently, an AND gate 58 issures a ONE as a load instruction to the bit-serial register 196 used for storing the value oa2 computed by the multiply-add processor 30.

A multiplexer 59 and a clocked delay line 591 are connected in a latch configuration in which a logic signal at the output port of the multiplexer 59 is updated every time the triangular coefficient generator 37 issues an update_wb signal that pulses to ONE from its normal ZERO state. When this occurs the current value of the update_nb signal from the triangular coefficient generator 37 is latched to generate an update_freq signal, the waveform of which is shown in FIG. 12. As shown in FIG. 16, an AND gate 197 ANDs the update_freq signal with a cordic$_{13}$ start signal that goes to ONE at the beginning of each cycle of multiply-add processor 30 instructions. The output signal from the AND gate 197 is ANDed in an AND gate 198 with an f_sw flag that is ONE during the CORDIC processor 40 instruction directing the loading of the value f; and, at a time when the update$_{13}$ freq signal is high, a ONE from the AND gate 198 commands the loading of the bit-serial register 192 with the value f computed by the CORDIC processor 40. The output signal from the AND gate 197 is also ANDed in an AND gate 199 with an $n_s$_sw flag that is ONE during the CORDIC processor 40 instruction directing the loading of the value $n_s$; and, at a time when the update$_{13}$ freq signal is high, a ONE from the AND gate 198 commands the loading of the bit-serial register 194 with the value $n_s$ computed by the CORDIC processed 40. A left-shifter 1910 multiplies the value of $n_s$ by $2^6$ as supplied to the multiplexers 401 and 402, so the divisions twice by $n_s$ in the CORDIC processor 40 do not generate quotients that overflow the output signal range of the CORDIC processor 40.

Figure 10:
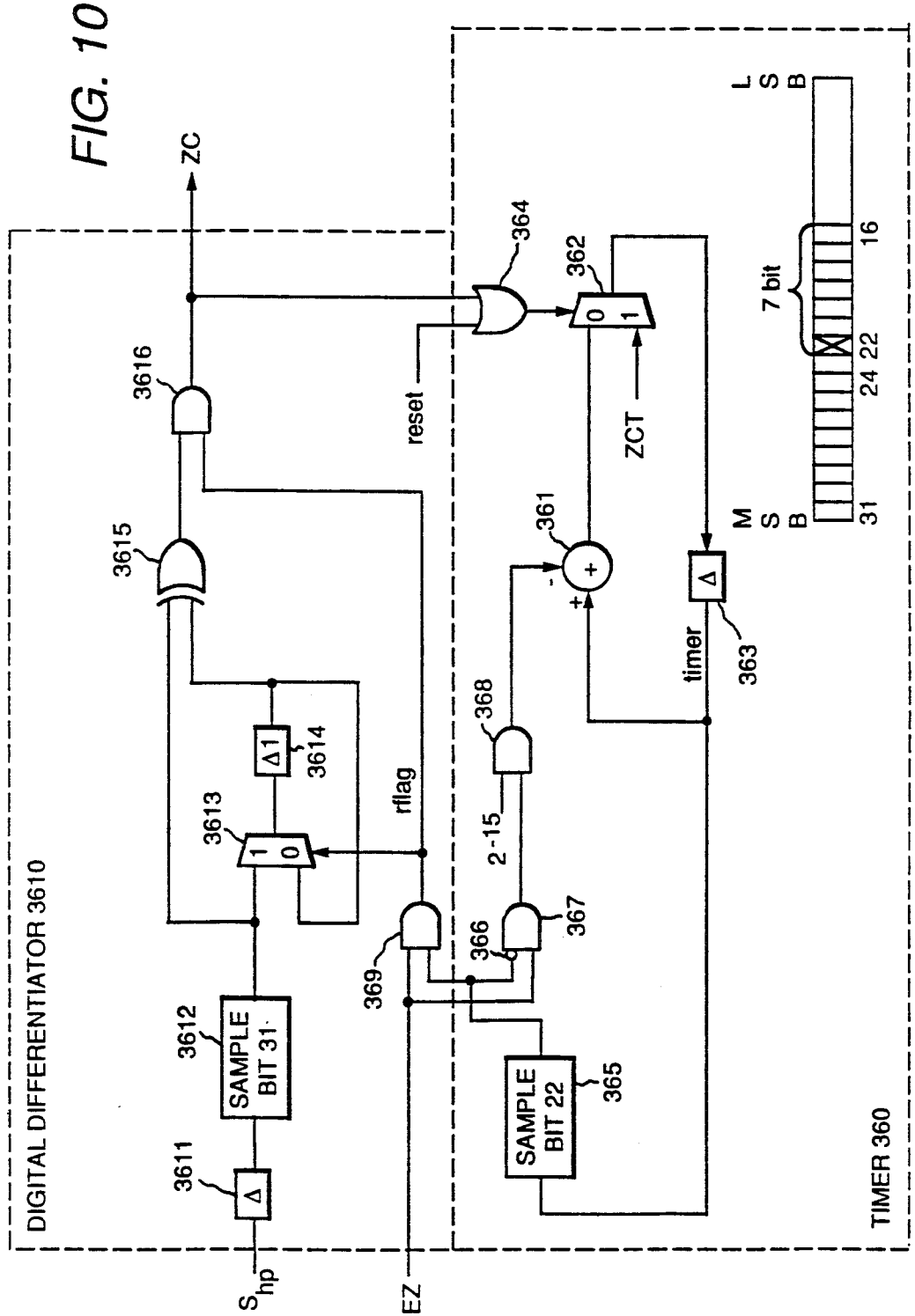
FIG. 10 is a schematic diagram of the zero-crossing detector used in the FIG. 1 power metering system.

FIG. 10 shows the construction of th zero-crossing detector 36 in greater detail. The operation of the zero-crossing detector 36 is enabled by an EZ flag being decoded from the processor 30 programmed instruction. The zero-crossing detector 36 essentially keeps a running tabulation of the sign bit of an input signal $s_{hk}$ thereto, selected from one of the $v_{hk}$ and $i_{hk}$ high-pass-filtering results as will be described in reference to FIG. 19A, and generates an indication of when the sign bit changes. The normally-ZERO output signal ZC of the zero-crossing detector 36 goes to ONE to indicate when the sign bit changed. To reduce the likelihood of a false indication of zero-crossing being generated in response to a noise spike or to harmonic distortion, a timer 360 is included in the zero-crossing detector 36 circuitry to generate an enabling signal rflag that when ONE permits the detector 36 to provide an indication of when the sign bit changes only after a perscribed time has elasped since the previous such indication.

The timer 360 is essentially a counter that counts down from a prescribed value ZCT read from the PROM 9. This counter comprises a bit-serial subtractor 361 arranged to feed back its difference output signal selectively through a multiplexer 362, to be delayed by one word in a clocked delay line 363 to generate a timer signal, which timer signal is then applied as minuend input signal to that subtractor 361. In the initiation of the down count, an OR gate 364 responds to either a reset signal or the zero-crossing detector 36 output signal ZC going to ONE to generate a ONE that conditions the multiplexer 362 to select the prescribed value ZCT to be delayed by one word in a clocked delay line 363 to generate the initial word of the timer signal. Circuitry 365 senses the logic state of the twenty-second bit of each bit-serial word of the timer signal, which is the sign bit thereof, and generates a logic signal holding the same logic state until the circuitry 365 senses the logic state of the twenty-second bit of the next bit-serial word. When the twenty-second bit of the prescribed value ZCT is sensed, it is invariably a ZERO owing to ZCT being positive quantity. Circuitry 365 responds to generate a logic signal ZERO. The response from the circuitry 365 is supplied to the input port of a logic inverter 366 that has its output port connected to supply one of the input signals to a two-input AND gate 367. AND gate 367 is conditioned to supply a ONE as output signal responsive to its input signal from the logic inverter 366 being a ONE concurrently with the other of its input signals, the EZ flag that is a ONE to enable the operation of the zero-crossing detector 36. The output signal from the AND gate 367 is supplied as one of the input signals to a two-input AND gate 368 that receives bit-serial $2^{-15}$ as the other of its input signals. AND gate 368 output signal is applied as subtrahend signal to the subtractor 361. As long as the AND gate 367 supplies a ONE as input to the AND gate 368, AND gate 368 supplies bit-serial $2^{-15}$ to the subtractor 361 as subtrahend signal. The counting down in timer 360 continues until the timer signal changes polarity, at which time the circuitry 365 furnished a ONE output signal. Inverter 366 responds this ONE to supply a ZERO to the AND gate 367, which responds to supply a ZERO to the AND gate 368. AND gate 368 responds to its ZERO input signal to supply an arithmetic zero subtrahend to the subtractor 361. Down counting accordingly is halted, so the circuitry 365 will continue to furnish a ONE output signal until the timer is reset by either the reset signal or the ZC signal going to ONE.

An AND gate 369 responds to the EZ flag and the output signal of the timer-sign-detector circuitry 365 concurrently being ONEs to generate the rflag signal. The rflag signal being ONE enables a digital differentiator 3610 that detects changes in the sign bit of a bit-serial signal supplied thereto from the output port of a clocked delay line 3611. The clocked delay line 3611 repeats at its output port the signal $s_{hk}$ (one of the signals $v_{h1}$, $i_{h1}$, $v_{h2}$, $i_{h2}$, $v_{h3}$ and $i_{h3}$) read to its input port from the RAM 6 after a delay equal to the duration of one bit-serial word, to provide input signal to $s_{hk}$-sign detector circuitry 3612. The $s_{hk}$-sign detector circuitry 3612 samples bit 31 of delayed $s_{hk}$ signal and holds that bit for the 32-bit duration of a bit-serial word. Providing that the rflag signal is ONE, the held bit is selected by a multiplexer 3613 to the input port of a clocked delay line 3614. The current held bit from the output port of the $s_{hk}$-sign detector circuitry 3612 is exclusively ORed with the signal at the output of the clocked delay line 3614 in an exclusive-OR gate 3615. As long as the rflag signal is continuously ONE, the exclusive-OR gate 3615 exclusively ORs the currently held and previously held sign bits, to differentiate digitally the held output of the $s_{hk}$-sign detector circuitry 3612. The result of this digital differentiation is applied as one input signal to a two-input AND gate 3616, which receives the rflag signal as the other of its input signals and generates the ZC signal at its output port. Except when a transition occurs in the sign bit of $s_{hk}$, both input signals to the exclusive-OR gate 3615 will be ZEROs or will be ONEs, causing the gate response to be a ZERO, in consequence of which the response ZC of the AND gate 3616 will be a ZERO. When a transition occurs in the sign bit of $s_{hk}$, one of the input signals to the exclusive-OR gate 3615 will be a ZERO and the other will be a ONE, causing the gate response to be a ONE, in consequence of which the response ZC of the AND gate 3616 will be a ONE, indicating the occurence of the zero-crossing.

As previously explained, ZC being a ONE resets the timer 360, conditioning the multiplexer 362 to apply ZCT to the input port of the clocked delay line 363. After the one-word delay in the clocked delay line 363, the sign bit of ZCT is detected by the timer-sign-detector circuitry 365. The rflag signal generated by AND gate 369 becomes a ZERO responsive to the output signal of the timer sign-detector circuitry 365 being a ONE. When the rflag signal is ZERO, the multiplexer 3613 is conditioned to recirculate the sign condition that generated the zero-crossing from the output port of the clocked delay line back to its input port until the timer counts down to zero. Any noise spike that causes the $s_{hk}$-sign detector circuitry 3612 to change its output condition while the rflag signal is ZERO is not admitted by the multiplexer 3613 into this recirculatory loop. Meanwhile, the rflag signal being ZERO causes the ZC signal to be ZERO irrespective of any difference in the recirculated sign bit and the sign bit currently detected by the $s_{hk}$-sign detector circuitry 3612.

Figure 11:
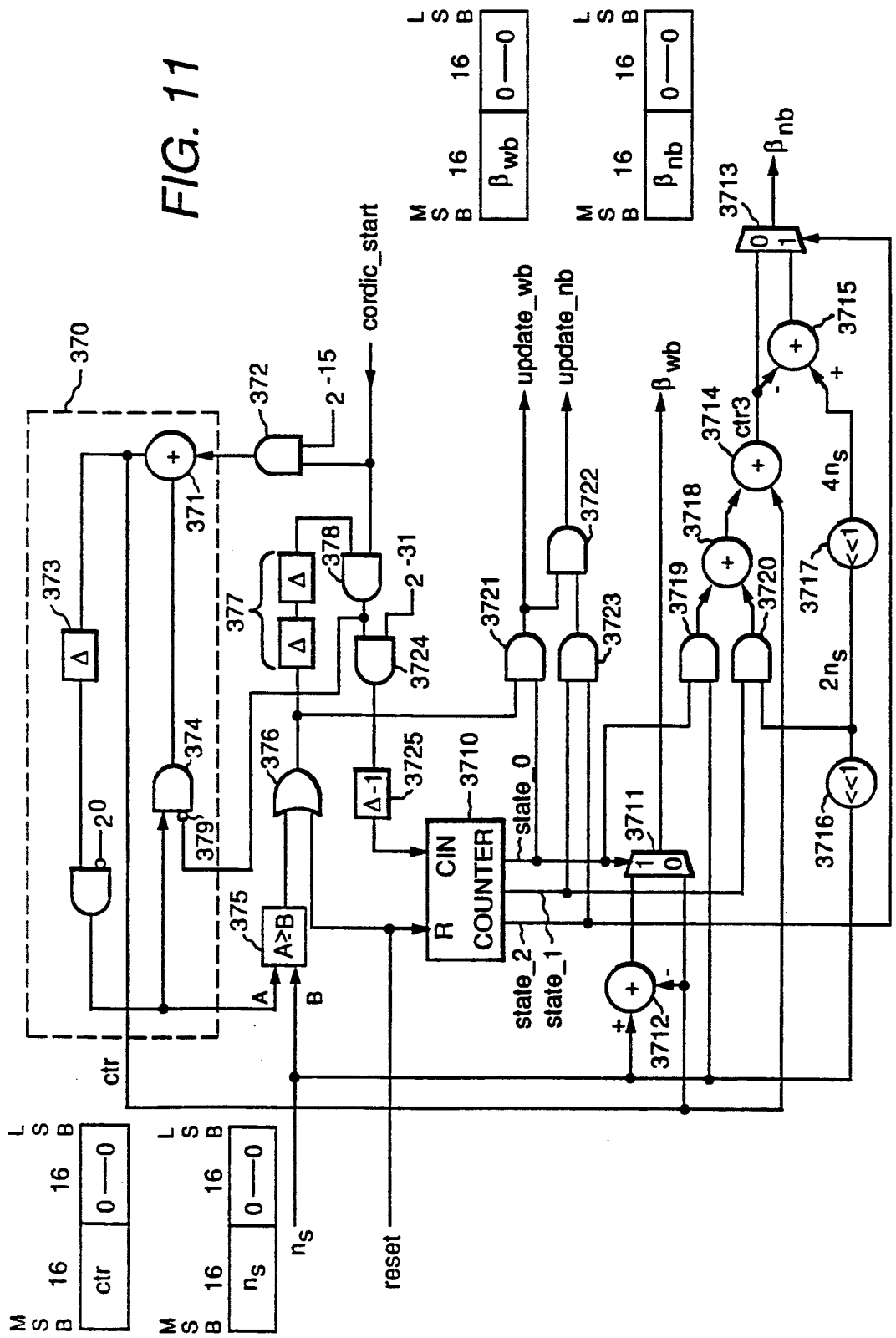
FIG. 11 is a schematic diagram of the triangular coefficient generator used to generate filtering coefficients for use by the FIG. 8 bit-serial multiply-add processor when performing $sinc^2$ digital low-pass filtering.

FIG. 11 shows the construction of the triangular coefficient generator 37 in greater detail. A bit-serial counter 370 cyclically counts up from arithmetic one to $n_s$, a value stored in the bit-serial register 194 and made available to the triangular coefficient generator 37, as shown in FIG. 9. The $n_s$ input signal is shown in FIG. 11 as being disposed in the sixteen most significant bits of the thirty-two bits cycling within the bit-serial register 194. The bit-serial counter 370 counts in the sixteen most significant bits subrange of the full thirty-two bit range for bit-serial signals in the processor 30 and essentially comprises a bit-serial adder 371 connected as an accumulator for bit-serial $2^{-15}$. The counting rate in the counter 370 is established by cordic_start pulses to ONE that are ANDed with bit-serial $2^{-15}$ in an AND gate 372 to furnish an augend input signal for the adder 371. The sum output signal from the adder 371 is delayed for the duration of one bit-serial word in a clocked delay line 373, and the delayed sum signal is selectively applied as an addend input signal to the bit-serial adder 371 via an AND gate 374. The bit-serial delayed sum signal from the clocked delay line 373 is compared to the bit-serial value $n_s$ as read from the bit-serial register 194. This comparison is done by a bit-serial comparator 375, which outputs a string of ONEs when the count has reached $n_s$. An OR gate 376 responds to a ONE from the comparator 375 or to a ONE supplied as a reset signal to generate a ONE at its output port. ONEs at the output of the OR gate 376 are delayed for the duration of two bit-serial words in a clocked delay line 377 to be ANDed with the next cordic_start pulse in a two-input AND gate 378. The resulting ONEs in the normally ZERO output signal from the AND gate 378 is inverted in a logic inverter 379 to cause the normally ONE logic signal applied to AND gate 374 to go to ZERO, to interrupt accumulation by the adder 371 and to instead supply arithmetic zero as the addend input signal to the adder 371. At the same time the cordic_start pulse enables the AND gate 372 to apply $b^{-15}$ to the adder 371 and so reset it to the bit-serial $2^{-15}$ value that is reckoned as arithmetic one in comparing to $n_s$.

The triangular coefficient generator 37 of FIG. 11 includes another counter 3710, which is a bit-parallel counter that includes three cascaded counter stages. The first of these stages generates a state_0 output signal, which has transitions between ZERO and ONE logic states corresponding to the counter 370 reaching $n_s$ count. The second of these stages generates a state_1 output signal, which has transitions between ZERO and ONE logic states corresponding to the ONE-to-ZERO transitions of the state_0 signal. The third of these stages generates a state_2 output signal, which has transitions between ZERO and ONE logic states corresponding to the ONE-to-ZERO transitions of the state_1 signal. The string of ONEs furnished from the AND gate 378 as reset signal for the bit-serial counter 370 is applied as one input of a two-input AND gate 3724, which receives bit-serial $2^{-31}$ as its other input signal. AND gate 3724 responds to generate a reset pulse that is only one clock cycle long, which the silicon compiler program arranges to be delayed negative-one-bit duration respective to all associatede circuitry, as indicated by a psuedo-delay element 3725. The negative delay of the counter 3710 reset pulse in the psuedo-delay element 3725 cannot actually exist, of course, but the silicon compiler program counterfeits it by intoducing a unit-delay clocked latch in every circuit path parallelling that circuit path in which the psuedo-delay element 3725 is shown. This is done to synchronize an update_wb signal going to ONE with the leading edge of the cordic_start pulse. The advanced-in-relative-time, one-clock-cycle-long reset pulse is applied to the counter 3710 to reset each of its three counter stages, causing each of the signals state_0, state_1 and state_2 to be ZERO-valued. The relative timing of the ctr count output of the counter 370 and of the signals state_0, state_1 and state_2 from counter 3710 are shown in FIG. 12.

A $\beta_{wb}$. The subtractor 3712 receives $n_s$ as minuend input signal, receives ctr as a subtrahend input signal, and generates an $n_s$-ctr difference output signal.

Figure 12:
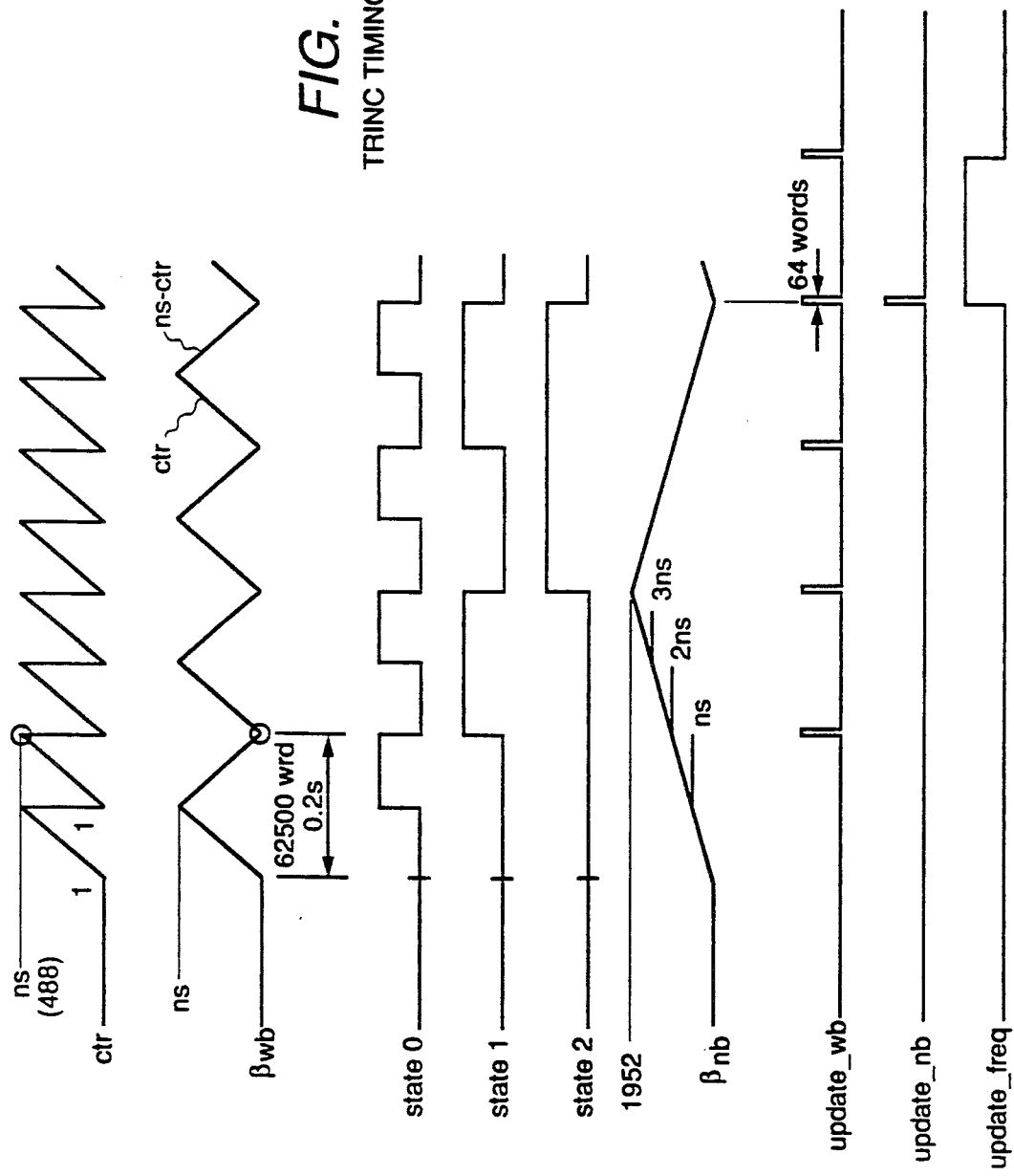
FIG. 12 is a timing diagram showing waveforms associated with the FIG. 11 triangular coefficient generator, as plotted against time.

A $\beta_{nb}$ signal supplied from the multiplexer 3713 is, as shown in FIG. 12, a symmetrical triangular filtering kernel $8n_s$ samples wide. As shown in FIG. 11, during the counting cycles when state_2 is ZERO, the state_2 signal conditions a multiplexer 3713 to select a rising portion of its output signal $\beta_{nb}$, as supplied by the sum output signal of a bit-serial adder 3714. During the counting cycles when state_2 is ONE, the state_2 signal conditions the multiplexer 3713 to select a falling portion of its output signal $\beta_{nb}$, as supplied by the difference output signal of a bit-serial subtractor 3715. The value $n_s$ is multiplied by two by a shift 3716 of all bits by one bit place towards greater significance, to generate an input signal for an AND gate 3720; and the result $2n_s$ from shift 3716 is multiplied by two by a shift 3717 of all bits by one bit place towards greater significance, to generate a minuend signal of $4n_s$ for the subtractor 3715. The sum output signal of the bit-serial adder 3714 is used by the subtractor 3715 as its subtrahend input signal. The adder 3714 generates a ramp up to $4n_s$ during the four successive ctr ramps that state_2 is ZERO after the triangular coefficient generator is started, which is selected by the multiplexer 3713 as the rising portion of its output signal $\beta_{nb}$. The adder 3714 again generates a ramp up to $4n_s$ during the next four successive ctr ramps when state_2 is ONE, which ramp is subtracted from $4n_s$ in the subtractor 3715 to generate a complementary ramp therefrom; and this complementary ramp is selected by the multiplexer 3713 as the falling portion of its output signal $\beta_{nb}$.

In generating each ramp up to $4n_s$ as its sum output signal, the adder 3714 receives the counter output ctr as its augend input and the sum output from another bit-serial adder 3718 as its addend input. The adder 3718 receives as its addend and augend input signals the output signals from an AND gate 3719 and the AND gate 3720. At the beginning of the ramp output from the adder 3714, the ZERO-valued state_0 and state_1 signals as applied to AND gates 3719 and 3720 condition them to supply arithmetic-zero addend and augend input signals to the adder 3718. The adder 3718 sums these arithmetic zeroes to generate as sum output signal an arithmetic zero supplied to adder 3714 as its addend input signal. The adder 3714 sum output is accordingly equal to its ctr augend input signal.

In the next cycle of ctr output from the counter 370, the ONE-valued state_0 signal applied as one input signal of the AND gate 3719 conditions it to reproduce the $n_s$ signal received as its other input signal, to be used as addend signal by the adder 3718. The ZERO-valued state_1 signal as applied to AND gate 3720 conditions it to supply arithmetic-zero augend input signal to the adder 3718. The sum output signal from the adder 3718 accordingly correseponds to $n_s$. The adder 3714 receives ctr signal as both addend and augent, so its sum output signal is $n_s$+ctr.

In the next cycle of ctr output from the counter 370, the ZERO-valued state_0 signal as applied to AND gate 3719 conditions it to supply arithmetic-zero addend input signal to the adder 3718. The ONE-valued state_1 signal applied as one input signal of the AND gate 3720 conditions it to reproduce the $2n_s$ signal received as its other input signal, to be used as augend signal by the adder 3718. The sum output signal from the adder 3718 accordingly corresponds to 2ctr. The adder 3714 receives $2n_s$ signal as addend and ctr signal as augend, so its sum output signal is 2ns+ctr.

In the next cycle of ctr output from the counter 370, the ONE-valued state_0 signal applied as the input signal of the AND gate 3719 conditions it to reproduce the $n_s$ signal received as its other input signal at its output port, to be used as addend signal by the adder 3718. The ONE-valued state_1 signal applied as one input signal of the AND gate 3720 conditions it to reproduce the 2ns signal received as its other input signal, to be used as augend signal by the adder 3718. The sum output signal from the adder 3718 accordingly corresponds to $3n_s$. The adder 3714 receives $3n_s$ signal as addend and ctr signal as augend, so its sum output signal is $3n_s$+ctr.

An AND gate 3721 responds to the final count of the counter 370 occurring when the state_0 signal is ONE to generate a ONE pulse in the normally-ZERO signal called update_wb, which signals the conclusion of a relatively-wide-band (i.e., relatively-narrow-kernel) low-pass filtering sequence in the multiply-add processor 30. Since ctr is incremented each time cordic_start occurs, the duration of update_wb signal ONE is equal to the duration of one multiply-add processor 30 program cycle—i.e., sixty-four bit-serial words. An AND gate 3722 receives update_wb at one of its input ports. Every fourth time the update_wb signal pulses to ONE, an AND gate 3723 responds to both the state_1 and state_2 signals being concurrently ONE to deliver a ONE to the other input port of the AND gate 3722. The AND gate 3722 responds to generate a ONE pulse in the normally-ZERO signal called update_nb, which signals the conclusion of a relatively-narrowband i.e., relatively-wide-kernel) low-pass filtering sequence in the multiply-add processor 30. The relatively-narrowband low-pass filtering sequence is used by the multiply-add processor 30 when it computes $f_a$; the processor 30 uses the relatively-wide-band low-pass filtering sequence for computations of other signals.

Figure 13:
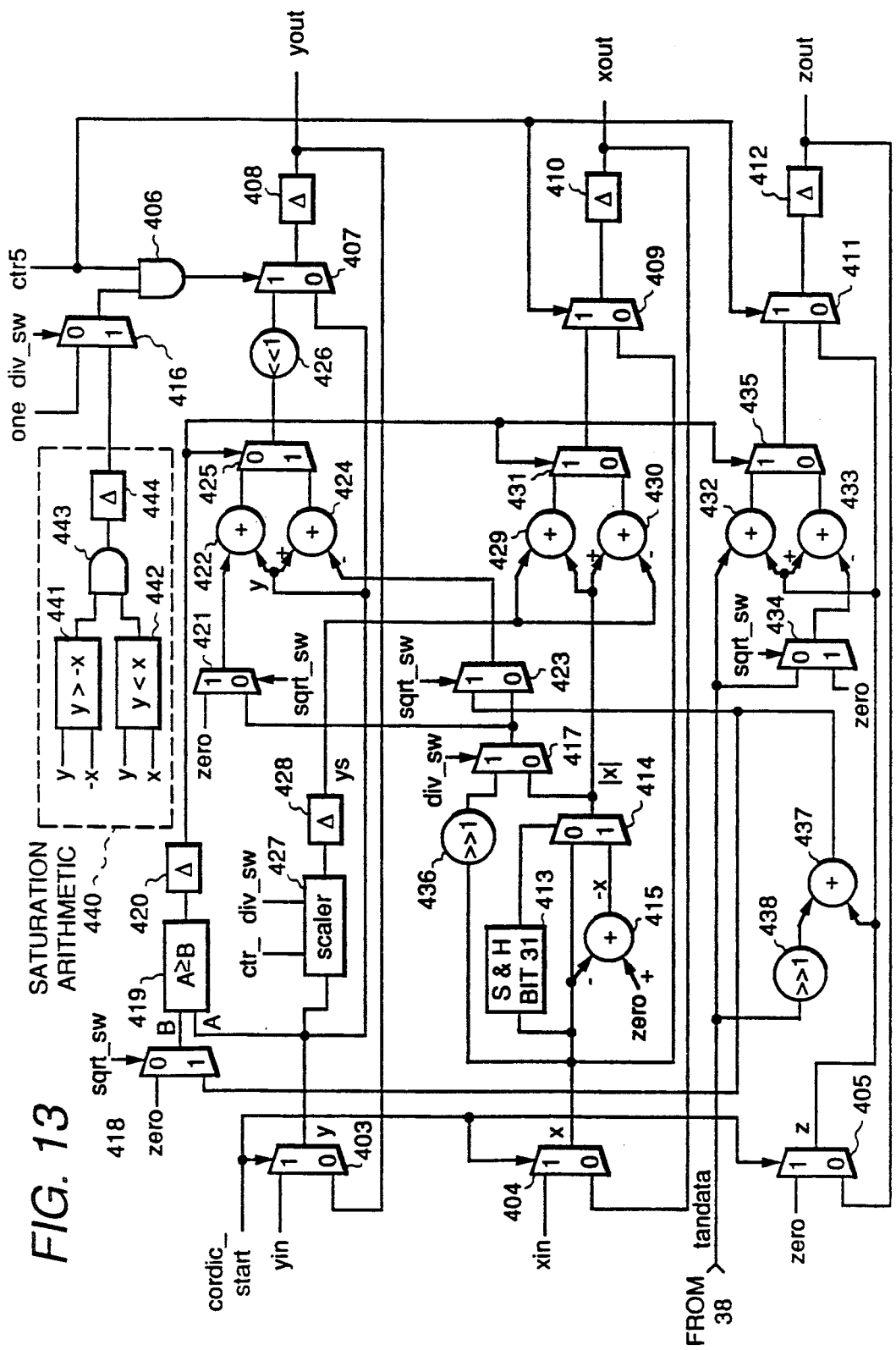
FIG. 13 is a schematic diagram of the bit-serial CORDIC processor that is the final processor in the FIG. 1 digital-signal processor cascade.

FIG. 13 shows the CORDIC processor 40 in greater detail. The processor 40 not only is capable of computing the arc tangent of yin/xin and the magnititude (xin,-yin) function simultaneously by an iterative CORDIC procedure, but is alternatively capable of performing non-restoring division or square-rooting computations using portions of the same digital hardware used in CORDIC computations. The CORDIC processor 40 comprises three bit-serial accumulators each selectively having incremental or decremental accumulating capability. A first of these bit-serial accumulators accumulates an xout signal and includes elements 404, 413-415, 429-431, 409 and 410. A second of these bit-serial accumulators accumulates a zout signal and includes elements 405, 432-435, 411 and 412. A third of these bit-serial accumulators accumulates a yout signal, and includes elements 403, 422, 424-426, 407 and 408.

The xout signal is the output signal for the processor 40 for the magnitude (xin,yin) function during CORDIC computation, when the vector resolved into xout and yout components orthogonal to each other is subjected to a series of successive rotations that reduce the yout component so as to approach arithmetic zero ever more closely and increase the xout component so as to approach the magnitude of the vector ever more closely. The bit-serial accumulator that accumulates the xout signal is not usefully employed in performing square rooting; and, when performing division, this bit-serial accumulator is operated as a serial memory for the magnitude of the xin signal, rather than incrementing or decrementing xout.

The bit-serial accumulator that accumulates zout signal generates the arc tangent of yin/xin during CORDIC computations by accumulating arc tangent radices supplied from ROM circuitry 38. These arc tangent radices have binary values such that accumulation requires addition or subtraction of full digital words. The non-restoring division and square rooting procedures when performed in bit-serial arithmetic in which the successive bits of a digital word are progressively more significant require accumulation of their respective partial-quotient and partial-square-root results on full-digital-word basis. This contrasts with the accumulation of those results being done on a successive-bit basis using a simple shift register when these computations are carried out in parallel-bit arithmetic or in a bit-serial arithmetic in which the successive bits of a digital word are progressively less significant. The bit-serial accumulator that accumulates zout signal, used to accumulate the arc tangent of yin/xin during CORDIC computations, is also used to accumulate the results of the non-restoring division and square rooting procedures performed in bit-serial arithmetic by the processor 40. This economizes the digital hardware used for performing the CORDIC division and square-rooting computations. The zout signal is the output signal for the CORDIC processor 40 for all functions except magnititude (xin,-yin).

In all of the iterative procedures performed by the processor 40, the yout signal is selectively incremented or decremented by the bit-serial accumulator that accumulates yout signal so as to bring the magnitude of yout towards a prescribed value, arithmetic zero for the CORDIC and non-restoring division computational procedures. To avoid loss of dynamic range in the computations as yout is systematically reduced in value the bit-serial accumulator for yout is of a type that shifts yout one place toward greater significance each successive computation step. The scaling of yout is accommodated by a compensatory scaling of all associated numbers relative to that normally required by the algorithm. When complputing yin/xin, x is held constant instead of being scaled by $\frac{1}{2}$ each iteration. When calculating the square root of yin, the trial value is scaled by $\frac{1}{2}$ each iteration instead of $\frac{1}{4}$. When performing Cordic rotation, y is modified using an unscaled x, and x is modified using y scaled by $2^{-i}$ during iteration step i, rather than x and y each being scaled by $2^{-i}$ before modifying the other, as is conventionally done in implementing the CORDIC algorithm. In all cases, the accumulation of zout is unaffected by the scaling of y and x.

The signal div_sw is a logic signal that is ZERO except when the processor 40 is to execute non-restoring division procedures; and the signal sqrt_sw is a logic signal that is ZERO except when the processor 40 is to execute non-restoring square rooting procedures. The signals div_sw and sqrt_sw are provided as respective single-bit fields in the instructions for the CORDIC processor 40 and control the multiplexers used to modify the routing of signals through the processor 40, so as selectively to implement each of the three different types of computations. The signal ctr5 is a logic signal which is high only during odd-numbered cycles of the 64-cycle CORDIC computation. When ctr5 is ZERO, the five-bit count output from the CORDIC program counter 108 (in FIG. 2) defines the address in the PROM 9 of one of the thirty-two CORDIC instructions for the CORDIC processor 40. When ctr5 is ONE, the count output from the counter 108 address in the instruction PROM 9 a cordic coefficient for the CORDIC processor 40. Each CORDIC instruction accessed when ctr5 is ZERO is maintained when ctr5 is next ONE, reflective of the fact that the processor 40 requires two word intervals per computational cycle.

During the time the cordic_start signal is ONE, a multiplexer 403 selects its output signal y to equal the yin signal supplied as its first input signal from the multiplexer 402 of FIG. 16; a multiplexer 404 selects its output signal x to equal the xin signal supplied as its first input signal from the multiplexer 401 of FIG. 16; and a multiplexer 405 selects its output signal z to equal the arithmetic zero applied as its first input signal. The ctr5 signal applied as an input signal to the AND gate 406 is low, conditioning the output signal from the AND gate 406 to be low. The low output from the AND gate 406 conditions a miultiplexer 407 to select its output signal to equal the signal y received as an input signal from the multiplexer 403, which output signal is supplied to a word-length clocked delay line 408. The ctr5 signal being low conditions a multiplexer 409 to select its output signal to equal the signal x received as an input signal from the multiplexer 404, which output signal is supplied to a word-length clocked delay line 410. The ctr5 signal being low also conditions a multiplexer 411 to select its output signal to equal the signal z received as an input signal from the multiplexer 405, which output signal is supplied to a word-length clocked delay line 412. After the time the cordic__start signal is high, during the determination of the successive bits of the bit-serial yout, xout and zout signals by the CORDIC processor 40, the multiplexer 403 selects its output signal to equal the yout signal fed back as its second input signal from the output port of the clocked delay line 408; the multiplexer 404 selects its output signal to equal the xout signal from the CORDIC processor 40 fed back as its second input signal from the output port of the clocked delay line 410; and the multiplexer 405 selects its output signal to equal the zout signal fed back as its second input signal from the output port of the clocked delay line 412. Computations are carried forward only when the ctr5 signal applied as an input signal to the AND gate 406 is high, so the multiplexer 407 interrupts bit-serial latching operations in a loop through elements 408, 403 and 407; so the multiplexer 409 interrupts bit-serial latching operations in a loop through elements 410, 404 and 409; and so the multiplexer 411 interrupts bit-serial latching operations in a loop through elements 412, 405 and 411.

The computation algorithms require a positive-valued divisor $|x|$ for use with the dividend yin. During the bit-serial latching operation of the loop through elements 410, 404 and 409 when ctr5 is ZERO, the sign bit of the output signal x from the multiplexer 404 is sampled and held for one word duration by the sample-and-hold circuit 413. The held sign bit controls a multiplexer 414 in selecting as its output signal a replica of its x input signal if the held sign bit is a ZERO or a replica of its $-x$ input signal if the held sign bit is a ONE. That is, the output signal from the multiplexer 414 is $|x|$ when ctr5 is ONE during computation. The $-x$ input signal for the multiplexer 414 is obtained from a bit-serial subtractor 415 as the difference between arithmetic zero and the output signal x from the multiplexer 404.

Usually, in CORDIC computations the vector having orthogonal coordinates xout and yout is subjected to stepwise rotation that continually reduces the magnitude of yout towards zero and increases the magnitude of xout towards that of the complete vector. The respective angles of rotation involved in the successive rotation steps are progressively smaller and are accumulated to determine with increasing precision the angle of rotation zout that reduces yout to zero. In each step of the CORDIC computations the previous value of yout is compared to arithmetic zero to determine its sign, so as to determine whether being incremented or decremented by one half the previous value of xout will generate as a first cross-sum the desired result of a current value of yout of lesser magnitude than the previous value of yout, and the cross-sum providing the desired result is generated as updated yout. A second cross-sum is generated as updated xout, either by decrementing the previous value of xout by one half the previous value of yout if the previous value of yout was incremented by one half the previous value of xout in generating the first cross-sum, or by incrementing the previous value of xout by one half the previous value of yout if the previous value of yout was decremented by one half the previous value of xout in generating the first cross-sum. The determination of whether the previous value of yout is to be incremented or decremented. by one half the previous value of xout also determines whether the rotation step is to decrement or increment the angle of rotation zout.

As performed in processor 40, the generation of the first cross-sum is performed by incrementing or decrementing twice the previous value of yout by the previous value of xout. The generation of the second cross-sum is performed by incrementing or decrementing the previous value of xout by $2^{-2}$ yout the first step of computation, by $2^{-4}$ yout the second step of computation, by $2^{-6}$ yout the third step of computation, etc. These modifications of the CORDIC algorithm are made reflective of the fact that the bit-serial accumulator for yout is of a type that shifts yout one place towards greater significance each successive computation step, to avoid loss of dynamic range in the computations as yout is systematically reduced in value.

During CORDIC computations the control bit div__sw is ZERO, conditioning a multiplexer 416 continually to select successive ONEs as another input signal to the AND gate 406, in addition to its ctr5 input signal, causing the AND gate 406 output signal to replicate its ctr5 input signal. The control bit div__sw being ZERO-valued also conditions a multiplexer 417 to select $|x|$ as its output signal.

During CORDIC computations the control bit sqrt__sw is ZERO to cause a multiplexer 418 to select arithmetic zero as its output signal. The output signal from the multiplexer 418 is the value towards which yout is to be successively modified during each of the iterative computation steps. The arithmetic zero output signal selected by the multiplexer 418 is compared to a y output signal from the multiplexer 403 to determine the sign of y to indicate the direction in which modification of y is to be made, the comparison being made by a digital comparator 419 and the sign bit being stored for a word interval in a latch 420. The comparator 419 generates a ONE output signal when y is arithmetic zero or greater and otherwise generates a ZERO output signal. The latch 420 output signal being ONE or ZERO indicates whether the previous value of yout is to be incremented or decremented in generating an updated yout of decreased magnitude, whether the previous value of xout is to be decremented or incremented in generating an updated xout of increased magnitude, and whether arc tan radix from the ROM 38 is to decrement or increment the accumulated rotation angle zout.

The control bit sqrt__sw being ZERO also conditions a multiplexer 421 to apply the $|x|$ signal as previously selected by the multiplexer 417 to a bit-serial adder 422 as its augend input signal. The control bit sqrt__sw being ZERO-valued also conditions a multiplexer 423 to apply that previously selected $|x|$ signal to a bit-serial subtractor 424 as its subtrahend input signal. The addend input signal to the adder 422 and the minuend input signal to the subtractor 424 are each the y output signal from the multiplexer 403.

In the text that follows, the subscripts $(i-1)$, i and $(i+1)$ refer to the $(i-1)^{th}$, $i^{th}$ and $(i+1)^{th}$ successive iterations of the computation steps in the processor 40.

A multiplexer 425 selects the sum output from the adder 422 as the cross-sum of $y_i$ with $|x_i|$ if $y_i$ is negative, or selects the difference output from the subtractor 424 as the decremented or increment if $y_i$ is positive. The output signal from the multiplexer 425 is multiplied by two by a left-shifting clocked latch 426, and the resulting doubled signal is supplied as a second input signal to the multiplexer 407 as iteration value $y_{(i+1)}$.

The $y_i$ signal from the multiplexer 403 is scaled by a factor $\delta_i = 2^{-2i}$ in a scaler 427 and delayed in a clocked delay line 428 for one word duration, to then be used in generating the cross-sum of $x_i$ with $2^{-2i}y_i$. The output signal from the clocked delay line 428 is applied as augend input signal to a bit-serial adder 429 and as subtrahend input signal to a bit-serial subtractor 430. The addend input signal to the adder 429 and the minuend input signal to the subtractor 430 are each the $|x|$ output signal from the multiplexer 414. A multiplexer 431 responds to $y_i$ being zero or positive to select the sum output from the adder 429 to the multiplexer 409 as a second input signal thereto and responds to $y_i$ being negative to select the difference output from the subtractor 430 to the multiplexer 409 as the second input signal thereto. The second input signal to the multiplexer 409 is replicated in its output signal responsive to the ctr5 signal being high.

The z output signal from the multiplexer 405 is applied as augend input signal to a bit-serial adder 432 and as minuend input signal to a bit-serial subtractor 433. Arc tangent radix coefficients sequentially read from the read-only memory 38 are used as addend input signal by the adder 432. Furthermore, when the sqrt_sw control bit is ZERO, as during CORDIC computations, a multiplexer 434 selects to the subtractor 433 as its subtrahend input signal the tandata signal from ROM 38. A multiplexer 435 responds to $y_i$ having been zero or positive to select the sum output from the adder 432 to the multiplexer 411 as a second input signal thereto and responds to $y_i$ being negative to select the difference output from the subtractor 433 to the multiplexer 411 as the second input signal thereto. The second input signal to the multiplexer 411 is replicated in its output signal responsive to the ctr5 signal being high.

During the computation of yin/xin in accordance with a nonrestoring division procedure, the processor 40 operates as a fractional machine, with the most significant bits of xin and yin being their sign bits in a two's complement arithmetic and being followed by the binary point. During the computation of yin/xin, the div_sw signal is ONE. This conditions the multiplexer 416 to continuously select output signal from saturation arithmetic circuitry 440 as its output signal, conditions the multiplexer 417 to replicate in its output signal an $|x|/2$ signal, and conditions the scaler 427 output signal continuously to be ZEROs. Assuming that yin is smaller in magnitude than xin, the saturation arithmetic circuitry 440 generates a string of ONEs that enables non-restoring division procedures to go forward. As will be explained in detail further on, in connection with FIG. 15, the div_sw signal being ONE also conditions the arc tangent radix ROM circuitry 38 to supply bit-serial $2^{-1}$ during the first pair CORDIC program instructions, bit-serial $2^{-2}$ during the second successive pair of CORDIC program instructions, bit-serial $2^{-3}$ during the third successive pair of CORDIC program instructions, etc.

The scaler 427 output signal continuously being ZEROs causes the sum output of the adder 429 receiving the resulting arithmetic zero as addend input signal to equal its $|x|$ augend input signal as supplied from the multiplexer 414. It also causes the difference output of the subtractor 430 receiving the resulting arithmetic zero as subtrahend input signal to equal its $|x|$ minuend input signal as supplied from the multiplexer 414. Accordingly, the multiplexer 431 output signal is $|x|$, the same as the multiplexer 417 output signal, when yin/xin is being computed. After this value is selected by the multiplexer 409 when ctr5 is ONE to be circulated in the loop through elements 410, 404 and 409, the output signal from the multiplexer 404 will be $|x|$ throughout the computational cycle—i.e., until the next time cordic_start is high.

The multiplexer 417 responds to one half the $|x|$ output signal maintained from the multiplexer 404. The $|x|/2$ signal is supplied as the trial divisor in the non-restoring division process, either to be added to y in the adder 422 or to be subtracted from y in the subtractor 424. The x/2 signal selected by the multiplexer 417 is shown as being provided by a bit shifter 436 as shown in the circuit diagram supplied to a silicon compiler. In actuality, the bit shift towards lesser significance is provided by the silicon compiler introducing one-bit shifts towards greater significance in all parallel paths.

During the computation of yin/xin, the control bit sqrt_sw is ZERO to cause the multiplexer 434 to select tandata=$2^{-i}$ as the subtrahend input signal to the subtractor 433. Each successive time that ctr5 signal is a ONE, the value of z from the multiplexer 405, either as augmented by the $2^{-i}$ value of tandata in the adder 432, or as decremented by the $2^{-i}$ value of tandata in the subtractor 433, is selected by the multiplexer 435 to provide the updated value of z to be fed back to the multiplexer 405 via the clocked delay line 412 and used the next time that ctr5 signal is a ONE. The selections made by the multiplexer 435 (and by multiplexers 425 and 431) are made according to the sign of y computed in the previous one of the successive steps of comparing the dividend y or modified dividend to zero that are performed in a non-restoring division procedure, as one attempts to reduce the modified dividend magnitude. If $y_{(i-1)}$ (the previous value of y) was zero or positive, the magnitude of $y_i$ (the current value of y) is reduced by subtracting $|x|/2$, and the value of z from the multiplexer 405 as incremented by tandata=$2^{-i}$ in the adder 432 is selected by the multiplexer 435 to provide the updated value of z. If $y_{(i-1)}$ was negative, the magnitude of $y_i$ (the current value of y) is reduced by adding $|x|/2$, and the value of z from the multiplexer 405 as decremented by tandata=$2^{-i}$ in the subtractor 433 is selected by the multiplexer 435 to provide the updated value of z.

The control bit sqrt_sw being ZERO-valued also conditions the multiplexer 418 to select arithmetic zero as its output signal. The arithmetic zero output signal selected by the multiplexer 418 is compared to the output signal y from the multiplexer 403 to determine the sign bit of y, the comparison being made by the digital comparator 419 and the sign bit being stored for a word interval in the latch 420. The control bit sqrt_sw being ZERO-valued conditions the multiplexer 421 to apply an $|x|/2$ signal as previously selected by the multiplexer 417 to the adder 422 as its augend input signal. The control bit sqrt_sw being ZERO-valued also conditions the multiplexer 423 to apply that previously selected $|x|/2$ signal to the subtractor 424 as its subtrahend input signal. The addend input signal to the adder 422 and the minuend input signal to the subtractor 424 are each the y output signal from the multiplexer 403. A multiplexer 425 selects the sum output from the adder 422 if the previous value of y was negative, or selects the difference output from the subtractor 424 if the previous value of y was positive. In order to maintain dynamic range in the division procedure, between trial division computation steps, the value of $y - |x|$ or y+|x| selected by the multiplexer 425 is shifted one bit towards greater significance without shifting the trial divisor |x|, rather than following the alternative procedure of shifting the trial divisor |x| one bit towards lesser significance without shifting the value of y−|x| or y+|x| selected by the multiplexer 425. Accordingly, the output signal from the multiplexer 425 is multiplied by two by a left-shifter 426, to increase the significance of that output signal, and the resulting doubled signal is supplied as a second input signal to the multiplexer 407.

The saturation arithmetic circuitry 440 is used to keep the magnitude of the quotient zout no larger than unity. To keep the magnitude of the quotient zout in range |y| must be smaller than |x|. Circuitry 440 puts out a ONE only when |y| is sufficiently small that division can proceed satisfactorily. A bit-serial comparator 441 in circuitry 440 generates a ONE output signal whenever y exceeds xneg difference output signal from the subtractor 415, indicating a negative-valued y is not too large to be in range. A bit-serial comparator 442 in circuitry 440 generates a one as its output signal whenever y is less than x, indicating a positive-valued y is not too large to be in range. An AND gate 443 in circuitry 440 responds to both indications of y being in range to generate a string of ONEs supplied as input signal to a clocked delay line 444 to be delayed one word before appearing as output signal from the saturation arithmetic circuitry 440. If positive y is out of range, the comparator 419 will continually output ONEs after the ZERO sign bit of y is past, and the accumulation of zout will result in its most positive value, a string of ONEs followed by a ZERO sign bit. If negative y is out of range, the comparator 419 will continually output ZEROs after the ONE sign bit of y is past, and the accumulation of zout will result in its most negative value, a string of ZEROs followed by a ONE sign bit.

The non-restoring square-rooting procedure to compute $(yin)^{\frac{1}{2}}$ is similar in many respects to a non-restoring division procedure. However, $y_i$ is the radicand when $i=1$ and is otherwise residual radicand, rather than being the dividend when $i=1$ and otherwise being the residual dividend. The trial divisor of the non-restoring division procedure becomes a trial square root to be divided into the residual radicand to generate a result to be compared to the trial test root itself, to determine whether or not the radicand or residual radicand is to be decremented. Since the trial square root to be divided into the residual radicand is to be derived from the zout square root thusfar extracted, there is no need to keep track of the trial test root itself in a separate xout register. In the first computational step the trial square root is invariably one-quarter or binary 0.01.

During the computation of $(yin)^{\frac{1}{2}}$ the control bit div_sw is ZERO, conditioning the multiplexer 416 continually to select successive ONEs as another input signal to the AND gate 406, in addition to its ctr5 input signal, causing the AND gate 406 output signal to replicate its ctr5 input signal.

During the computation of $(yin)^{\frac{1}{2}}$ the control bit sqrt_sw is ONE. As will be explained in detail further on, in connection with FIG. 15, this conditions the arc tangent radix ROM circuitry 38 to supply, as tandata signal, bit-serial $2^{-1}$ during the first pair CORDIC program instructions, bit-serial $2^{-2}$ during the second successive pair of CORDIC program instructions, bit-serial $2^{-3}$ during the third successive pair of CORDIC program instructions, etc. The sqrt_sw signal being ONE also conditions the multiplexer 421 to select arithmetic zero to the adder 422 as its addend input signal, so its sum output signal equals its augend input signal y. Accordingly, the residual radicand can only be decremented. The control bit sqrt_sw being ONE also conditions the multiplexer 423 to select to the subtractor 424 as its subtrahend input signal a trial square root that is the sum output signal of an bit-serial adder 437, receiving the z output signal from the multiplexer 405 as its augend input signal and receiving tandata/2 as its addend input signal. The tandata/2 signal is shown as being provided to the adder 437 by a bit shifter 438, as shown in the circuit diagram supplied to a silicon compiler, but in actuality the bit shift towards lesser significance is provided by the silicon compiler by introducing one-bit shifts towards greater significance in all parallel paths. The control bit sqrt_sw being ONE also conditions the multiplexer 434 to select arithmetic zero to the subtractor 433 as its subtrahend input signal. Accordingly, the accumulation of the square root is invariably incremental when it occurs. Furthermore, the sqrt_sw signal being ONE conditions the multiplexer 418 to select the trial square root against which to compare the radicand or residual radicand $y_i$ in order to determine whether or not $y_{(i+1)}$ is or is not to be decremented.

Figure 14:
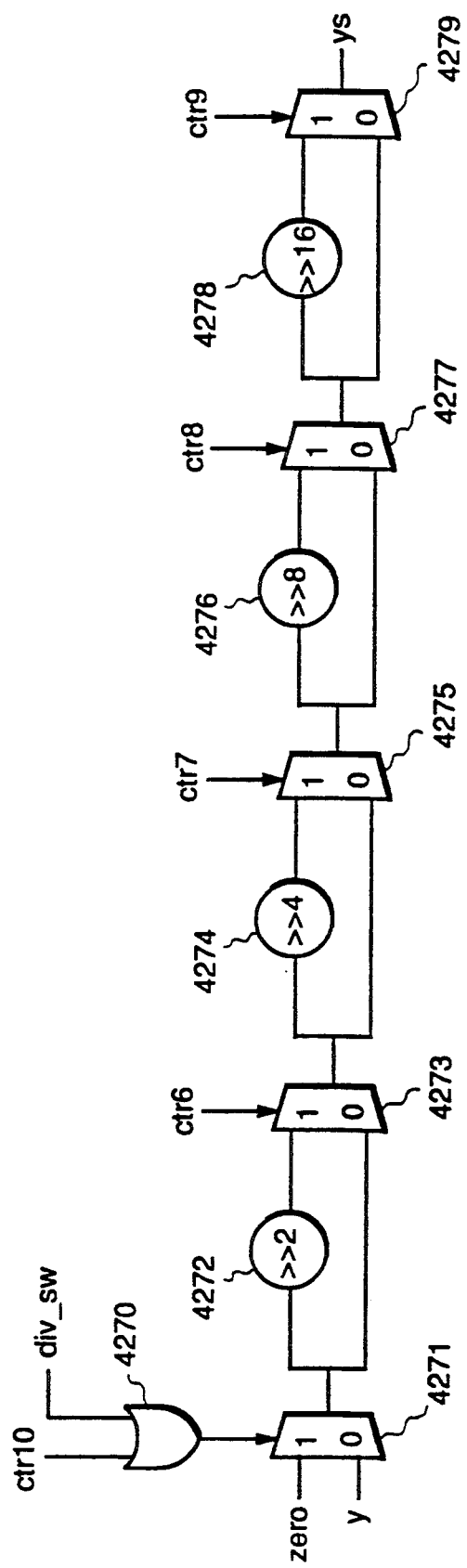
FIG. 14 is a schematic diagram of the scaler used in the FIG. 13 CORDIC processor.

FIG. 14 shows the operation of the scaler 427 in greater detail. The signals ctr5, ctr6, ctr7, ctr8, ctr9 and ctr10 are the successively more significant of the six most significant bits of the count output of the counter 103 (of FIG. 2). An OR date 4270 responds to the div_sw control bit being ONE during the computation of yin/xin to cause a multiplexer 4271 to select arithmetic zero as input signal to the rest of the scaler circuit 427, resulting in its output being arithmetic zero. The OR gate 4270 also responds to the ctr10 output from the counter 103 reaching ONE at full count to select arithmetic zero as input signal to the rest of the scaler circuit 427, resulting in its output being arithmetic zero.

Except when the OR gate 4270 output signal is a ONE, the scaler 427 responds to the sixteen successive count conditions of the ctr6, ctr7, ctr8 and ctr9 signals from the counter 103 to right-shift the bit-serial signal ys from the scaler 427 by twice the number of bits in that count, as referenced to the bit-serial signal y supplied to the scaler 427.

FIG. 14 shows a two-bit-right shifter 4272 and a multiplexer 4273 used to selectively divide by a factor of four responsive to ctr6 signal being ONE, a four-bit-right shifter 4274 and a multiplexer 4275 used to selectively divide by a factor of sixteen responsive to ctr7 signal being ONE, an eight-bit-right shifter 4276 and a multiplexer 4277 used to selectively divide by a factor of 256 responsive to ctr8 signal being ONE, a 16-bit-right shifter 4278 and a multiplexer 4279 used to selectively divide by a factor of 65 536 responsive to ctr9 signal being ONE. In actuality, bit shifts towards lesser significance are provided by the silicon compiler introducing delays in all parallel signal paths to shift those parallel signal paths towards greater significance; this procedure using left-shifters in all parallel signal paths is necessary since right-shifters per se. are not available in bit-serial format.

Figure 15:
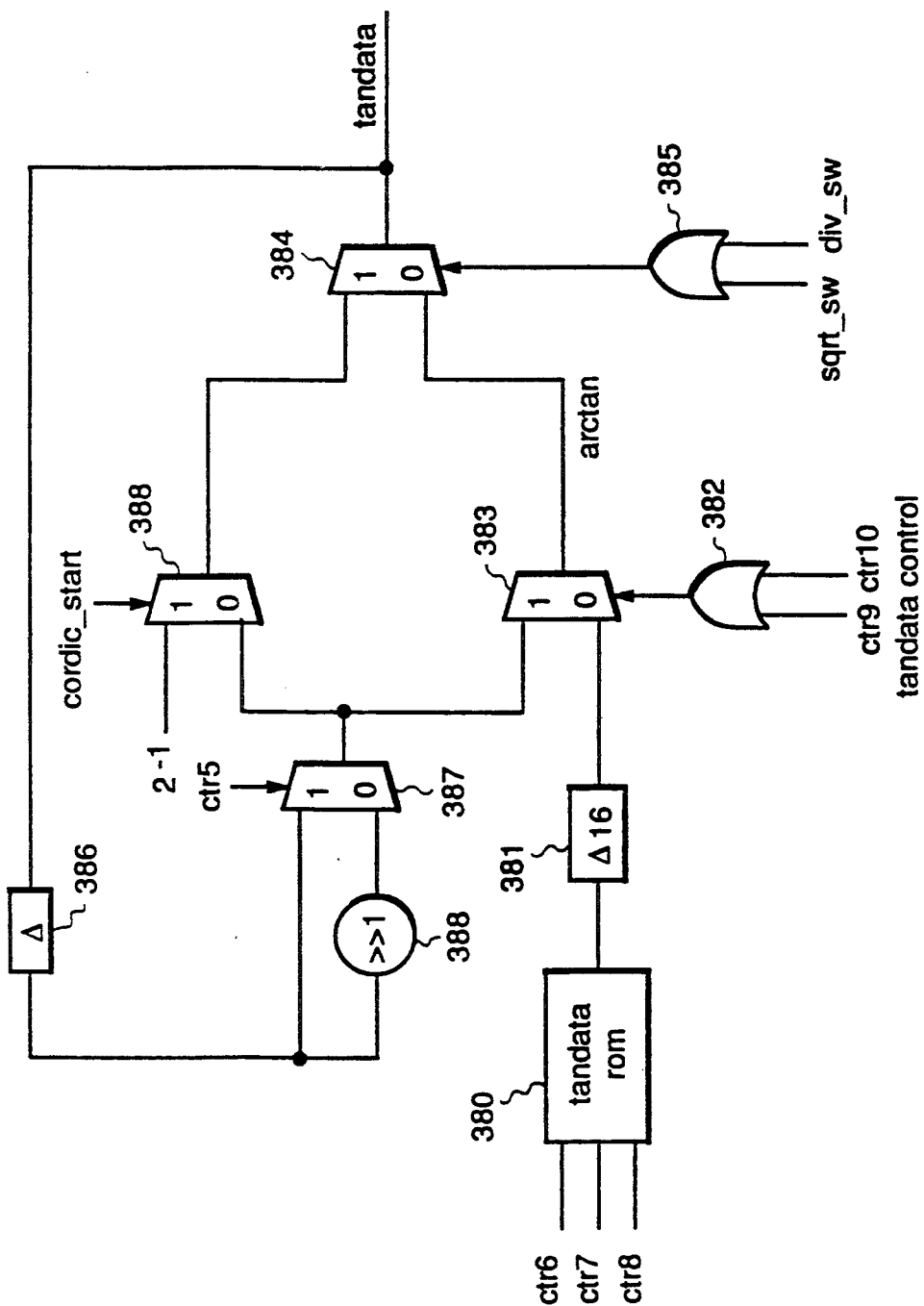
FIG. 15 is a schematic diagram showing more specifially the interface between the arc tan radix read-only memory and the CORDIC processor, shown generally in FIG. 1.

FIG. 15 shows more particulary the details of the arc tangent radix ROM circuitry 38. A reduced size for the actual ROM 380 is made possible by the fact that for smaller angles the tangent function is almost linearly proportional to the angle. Accordingly, the actual ROM 380 stores the arc tangent radices of only the eight largest angles having tangents that are declining negative integral powers of two, which arc tangent radices are successively addressed by an address comprising the ctr6, ctr7 and ctr8 outputs of the counter 103. The stored arc tangent radices are only sixteen bits long but are read out through a parallel-in/serial-out output register within the ROM 380 in such manner that they are followed by sixteen trailing ZEROs, and a clocked delay line 381 delays the ROM 380 serial output to shift the sixteen trailing ZEROs to appear as leading ZEROs. As long as ctr9 and ctr10 outputs of the counter 103 applied as input signals to a two-input OR gate 382 are both ZERO during the first $2^9$ counts of the counter 103 (eight cycles of conditioning a multiplexer 383 to select arc tangent radices from the ROM 380 as an input signal to a further multiplexer 384. The multiplexer 384 replicates in its own output signal the arctan output signal from the multiplexer 383 responsive to the output signal from an OR gate 385 being ZERO. The output signal from the OR gate 385 is ZERO as long as the sqrt_sw and div_sw signals it receives as its input signals are both ZERO — i.e., during the computation of the arc tangent of yin/xin.

During the computation of the arc tangent of yin/xin, the tandata output signal of the multiplexer 384, as delayed one word in a clocked delay line 386, is applied as one of the input signals to a multiplexer 387. The other input signal of the multiplexer 387 is one-half as large and is generated by a bit shifter 388 from the output signal of the clocked delay line 386. A ctr5 control signal conditions the output signal of the multiplexer 387 to replicate the larger input signal when ctr5 signal is ONE and the smaller input signal when ctr5 signal is ZERO. After the first $2^9$ counts of the counter 103 (eight cycles of CORDIC computations), the OR gate 382 output signal is ONE, conditioning the multiplexer 383 to replicate in its own output signal the output signal from the multiplexer 387. Accordingly, the smallest arc tangent radix stored in the ROM 380 is halved once each successive even CORDIC computation cycle, to appear as the tandata output of the multiplexer 384.

During the computation of yin/xin or the square root of yin, one of the input signals of the OR gate 385 will be a ONE, conditioning the multiplexer 384 to replicate the output signal of a multiplexer 388 in its tandata output signal, rather than the arctan output signal of the multiplexer 383. When the cordic_start signal is high, during the initial cycle of a CORDIC instruction, the multiplexer 388 selects bit-serial $2^{-1}$ as its output signal, and tandata signal is accordingly bit-serial $2^{-1}$ as well. Thereafter, the multiplexer 388 replicates in its own output signal the output signal of the multiplexer 387, so bit-serial $2^{-1}$ is successively halved each even CORDIC instruction, to appear as the tandata output signal from the multiplexer 384.

In FIG. 16 the CORDIC processor 40 receives an xin input signal as selected by a multiplexer 401 and a yin input signal as selected by a multiplexer 402. The CORDIC processor 40 parallelly generates a yout bit-serial output signal and a zout bit-serial output signal, which signals are supplied to respective input ports of a two-input multiplexer 400. The yout or zout bit-serial output signal selected by the multiplexer 400 is fed back as respective input signals for the multiplexers 401 and 402, so that successive computations can be made by the CORDIC processor 40. In power metering applications the CORDIC processor 40 furnishes output data back to the multiply-add processor 30 only when processor 40 has computed $n_s$ or f. To implement furnishing $n_s$ and f back to the multiply-add processor 30, the multiplexer 400 output signal provides respective input signals for the registers 192 and 194 in register bank 19 by suitable connections.

As noted previously in regard to FIG. 1, processing through the CORDIC processor 40 is done on a time-division-multiplexed basis, and provision is made for metering two functions at the same time. Responsive both to cordic_start being high during the first word interval of each CORDIC instruction cycle and to a load1_sw signal being high, an AND gate 68 generates a ONE output signal that directs the loading of the bit-serial indications of the function digout1 into the bit-serial output register 60. Responsive both to cordic_start being high during the first of each cycle of CORDIC instructions and to a load2_sw signal being high, an AND gate 69 generates a ONE output signal that directs the loading of the bit-serial indications of the function digout1 into the bit-serial output register 62.

Each of the pulse duration modulators 64 and 66 access a shared PDM counter (not specifically shown) which is a bit-serial counter included in the clock generator 100 and counts a modular number (e.g., $2^{15}$) of the 10 MHz oscillations of the crystal oscillator in the clock generator 100. The pulse duration modulator 64 includes a respective bit-serial comparator (not specifically shown) for comparing digout1 in bit-serial form to the bit-serial count supplied from the PDM counter, thereby to generate its train of output pulses. Similarly, the pulse duration modulator 66 includes a respective bit-serial comparator (not specifically shown) for comparing digout2 in bit-serial form to the bit-serial count supplied from the PDM counter, thereby to generate its train of output pulses. Two additional bits of resolution are afforded the PDM output signals by selectively generating, when the ten most significant bits of the digout1 or digout2 signal are determined to correspond to the PDM count, a ONE-valued signal of one-quarter, one-half, or three-quarter word duration depending on the eleventh and twelfth most significant bits of the digout1 or digout2 signal being 01, 10 or 11 respectively, rather than 00. The ONE-valued signal is used to extend the pulse duration defined by the bit-serial comparator response.

FIG. 16 shows the PDM generator 66 connected for applying its pulses as a first input signal of a two-input exclusive_OR gate 70, supplying pdm2 output signal that corresponds to the pulses from the PDM generator 66 except when load1_sw and load2_sw signals are both high at the same time that cordic_start pulses high. Under these condtions, digout1 and digout2 are the same, and the pulses put out by the PDM generators 64 and 66 are the same. A multiplexer 71 receptive of the output signals of the AND gates 68 and 69 receives two ONEs as input signals and responds to supply a ONE as its output signal. The output signal of the multiplexer 71 is applied to the exclusive-OR gate 70 as its second input signal. The pdm2 signal supplied from the exclusive-OR gate 70 is the complement of the pulses from the PDM generator 66. The PDM generators 64 and 66 are thus arranged for providing push-pull drive for a center-reading D'Arsonval meter. A single-bit-duration clocked delay 72 is connected to latch the output signal state of the multiplexer 71 when the output signal of the AND gate 68 returns to ZERO.

The yout or zout bit-serial output signal selected by the multiplexer 400 is applied as an input signal to the normalizer 39. As noted in the previous description of FIG. 1, the normalizer circuit 39 cooperates with the CORDIC processor 40 to provide for the calculation of the further primitive function:

(e) [sign (oa2)] * (yin −L)/M.

This function provides expanded scale readings on meters such as the meters 61, 63, 65 and 67 of FIG. 1, by first translating meter zero by the constant L and by then scaling down the translated reading by the factor M. Since in power metering this function is invariably the last of a string of computations, the yin signal for the last of a string of computations is identical to the yout multiplexer 400 output signal for the next-to-last of the string of computations. L and M are constants in CORDIC program instructions from the PROM 9 as extracted by elements 98 and 984-986 of FIG. 2 and supplied to the normalizer 39. A multiplexer 390 selects, as its output signal for application to the multiplexer 402, either the difference output signal from a subtractor 391 or the difference output signal from a subtractor 392. The yout signal furnished from the multiplexer 400 is subtracted from L in a subtractor 391, and L is subtracted from that yout signal in a subtractor 392. M is applied directly to the multiplexer 401 as an input signal thereto, to be used (in the last of a string of computations by the CORDIC processor 40) as an xin divisor for the (yout−L) dividend selected to processor 40 from the normalizer 39 by the multiplexer 402.

The polarity of oa2, sign(oa2), is determined from the oa2 bit serial data stored in the register 196, by sampling and holding bit 31 of oa2 in sample-and-hold circuitry 394. The sampled and held sign(oa2) is applied from circuitry 394 to a two-input AND gate 395. The AND gate 395 receives as its other input signal a signal sq—sw which is ZERO during all CORDIC computations except when it is desired to change the polarity of the final CORDIC output in accordance with sign(oa2) being negative. The AND gate 395 output signal is ZERO when the signal sq—sw is a ZERO and is [sign (oa2)] when the signal sq—sw is a ONE. An exclusive-OR gate 396 receives the AND gate 395 output signal and an n—sw signal as input signals and supplies its output response to the multiplexer 390 to control its selection between the output signals from the subcontractor 391 and the subtractor 392. The n—sw signal is a signal that is high when one wishes to reverse the senses of the digout1 and pdm1 output signals, or the senses of the digout2 and pdm2 output signals. If the n—sw signal is a ONE, the exclusive-OR gate 396 conditions the multiplexer 402 to select (L−yout) difference signal from the subtractor 391 for its output signal when the AND gate 395 output signal is a ZERO and to select (yout−L) difference signal from the subtractor 392 for its output signal when the AND gate 395 output signal is a ONE. If the n—sw signal is a ZERO, the exclusive-OR gate 396 conditions the multiplexer 402 to select (yout−L) difference signal from the subtractor 392 for its output signal when the AND gate 395 output signal is a ZERO and to select (L−yout) difference signal from the subtractor 391 for its output signal when the AND gate 395 output signal is a ONE.

One skilled in the art will be enabled by the reading of the foregoing disclosure to design many plural channel decimation filters embodying the invention, and this should be borne in mind when construing the scope of the claims which follow.

What is claimed is:
1. A decimation filter comprising:
means for supplying regularly recurring filter clock pulses;
a first binary counter, having zeroeth and first successive stages for generating respective bits of a first digital electric signal representative of a modulo-four count of said regularly recurring filter clock pulses as applied to its zeroeth stage, and generating an overflow pulse from its first stage each third one of said regularly recurring filter clock pulses as counted modulo-four;
a second binary counter, having a plurality of successive stages identified by respective consecutive numbers second through $(n-1)^{th}$ for generating respective bits of a second digital electric signal representative of a modulo-$2^{(n-2)}$ count of said overflow pulses from the first stage of said first binary counter;
means for generating a third digital electric signal by selectively complementing said second digital electric signal responsive to the bit supplied from the zeroeth stage of said first binary counter as the least significant bit of said first digital signal;
a digital multiplier, having a multiplicand input port connected for receiving said third digital electric signal, having a multiplier input port connected for receiving a stream of bits supplied at a rate one-quarter that at which said filter clock pulses regularly recur, and having a product output port;
a parallel-bit adder having an augend input port, having an addend input port to which the product output port of said digital multiplier is connected, and having a sum output port;
a first clocked latch having an input port to which the sum output port of said parallel-bit adder is connected, having an output port, and being clocked at the rate at which said filter clock pulses regularly recur;
a second clocked latch having an input port to which the output port of said first clocked latch is connected, having an output port, and being clocked at the rate at which said filter clock pulses regularly recur;
a third clocked latch having an input port to which the output port of said second clocked latch is connected, having an output port, and being clocked at the rate at which said filter clock pulses regularly recur;
a fourth clocked latch having an input port to which the output port of said third clocked latch is connected, having an output port, and being clocked at the rate at which said filter clock pulses regularly recur;
augend selection means for applying the signal from the output port of said fourth clocked latch to the augend input port of said parallel-bit adder except for each four clock pulse durations when the second binary counter is at zero count, for supplying the signal from the output port of said third clocked latch to the augend input port of said parallel-bit adder during the second and zeroeth clock pulse durations when the second binary counter is at zero count, and for supplying arithmetic zero to the augend input port of said parallel-bit adder during the first and third clock pulse durations when the second binary counter is at zero count;

means for extracting a first output signal for said decimation filter from the output port of said second clocked latch; and means for extracting a second output signal for said decimation filter from the output port of said fourth clocked latch.

2. A decimation filter as set forth in claim 1 wherein said augend selection means comprises:

a first multiplexer having a first input port to which the output port of said third clocked latch connects, having a second input port to which the output port of said fourth clocked latch connects, and having an output port; and a second multiplexer having a first input port to which the output port of said first multiplexer connects, having a second input port to which a parallel-bit arithmetic zero signal is applied, and having an output port connected to the augend input port of said parallel-bit adder.

3. A decimation filter as set forth in claim 1 wherein said means for extracting a first output signal for said decimation filter includes a first parallel-in/serial-out register having a parallel-bit input port to which the output port of said second clocked latch is connected and having a single-bit-wide serial output port from which said first output signal is supplied in bit-serial format; and wherein said means for extracting a second output signal for said decimation filter includes a second parallel-in/serial-out register having a parallel-bit input port to which the output port of said fourth clocked latch is connected and having a single-bit-wide serial output port from which said second output signal is supplied in bit-serial format.

4. A plural-channel decimation filter comprising:

means for supplying regularly recurring filter clock pulses;

a first binary counter, having zeroeth and first successive stages for generating respective bits of a first digital electric signal representative of a modulo-four count of said regularly recurring filter clock pulses as applied to its zeroeth stage, and generating an overflow pulse from its first stage each third one of said regularly recurring filter clock pulses as counted modulo-four;

a second binary counter, having a plurality of successive stages identified by respective consecutive numbers second through $(n-1)^{th}$ for generating respective bits of a second digital electric signal representative of a modulo-$2^{(n-2)}$ count of said overflow pulses from the first stage of said first binary counter;

means for generating a third digital electric signal by selectively complementing said second ditigal electric signal responsive to the bit supplied from the zeroeth stage of said first binary counter as the least significant bit of said first digital signal;

a first multiplexer having a first input port for receiving a first stream bits of supplied at a rate one-quarter that at which said filter clock pulses regularly recur, having a second input port for receiving a second stream of bits supplied at a rate one-quarter that at which said filter clock pulses regularly recur, and having an output port to which said first and second streams of bits are alternately selected as determined by the bit generated by said second stage of said second binary counter;

a digital multiplier, having a multiplicand input port connected for receiving said third digital electric signal, having a multiplier input port to which the output port of said first multiplexer is connected, and having a product output port;

a parallel-bit adder having an augend input port, having an addend input port to which the product output port of said digital multiplier is connected, and having a sum output port;

a first clocked latch having an input port to which the sum output port of said parallel-bit adder is connected, having an output port, and being clocked at the rate at which said filter clock pulses regularly recur;

a second clocked latch having an input port to which the output port of said first clocked latch is connected, having an output port, and being clocked at the rate at which said filter clock pulses regularly recur;

a third clocked latch having an input port to which the output port of said second clocked latch is connected, having an output port, and being clocked at the rate at which said filter clock pulses regularly recur;

a fourth clocked latch having an input port to which the output port of said third clocked latch is connected, having an output port, and being clocked at the rate at which said filter clock pulses regularly recur;

augend selection means for applying the signal from the output port of said fourth clocked latch to the augend input port of said parallel-bit adder except for each four clock pulse durations when the second binary counter is at zero count, for supplying the signal from the output port of said third clocked latch to the augend input port of said parallel-bit adder during the second and zeroeth clock pulse durations when the second binary counter is at zero count, and for supplying arithmetic zero to the augend input port of said parallel-bit adder during the first and third clock pulse durations when the second binary counter is at zero count;

means for extracting a first output signal for said decimation filter from the output port of said second clocked latch; and means for extracting a second output signal for said decimation filter from the output port of said fourth clocked latch.

5. A plural-channel decimation filter as set forth in claim 4 wherein said means for extracting a first output signal for said decimation filter includes a first parallel-in/serial-out register having a parallel-bit input port to which the output port of said second clocked latch is connected, having a single-bit-wide serial input port, and having a single-bit-wide serial output port from which said first output signal is supplied in bit-serial format; and wherein said means for extracting a second output signal for said decimation filter includes a second parallel-in/serial-out register having a parallel-bit input port to which the output port of said fourth clocked latch is connected, having a single-bit-side serial input port, and having a single-bit-wide serial output port from which said second output signal is supplied in bit-serial format.

6. A plural-channel decimation filter as set forth in claim 5 in combination with:

at least one other such plural-channel decimation filter;

means connecting the respective first parallel-in/serial-out registers of said plural-channel decimation filters in a first bit-serial loop, with the single-bit-wide serial output port of each first parallel-in/serial-out register connected to the single-bit-wide serial input port of a respective other one of said first parallel-in/serial-out registers;

means connecting the respective second parallel-in/serial-out registers of said plural-channel decimation filters in a second bit-serial loop, with the single-bit-wide serial output port of each second parallel-in/serial-out register connected to the single-bit-wide serial input port of a respective other one of said second parallel-in/serial-out registers; and means for extracting bit-serial output signals from said first and second bit-serial loops.

7. A combination as set forth in claim 6 wherein said means for extracting bit-serial output signals from said first and second bit-serial loops comprises:

a second multiplexer having a first input port to which the single-bit-wide serial output port of one of said first parallel-in/serial-out registers in said first bit-serial loop is connected, having a second input port to which the single-bit-wide serial output port of one of said second parallel-in/serial-out registers in said second bit-serial loop is connected, and having an output port.

* * * * *